United States Patent
Oka et al.

[19]

[11] Patent Number: 6,045,886
[45] Date of Patent: Apr. 4, 2000

[54] ADHESIVE TAPE FOR ELECTRONIC PARTS

[75] Inventors: Osamu Oka; Takeshi Nishigaya, both of Shizuoka, Japan

[73] Assignee: Tomoegawa Paper Co., Ltd., Tokyo, Japan

[21] Appl. No.: 08/998,019

[22] Filed: Dec. 24, 1997

[30] Foreign Application Priority Data

Dec. 26, 1996 [JP] Japan .................................. 8-358155
Dec. 27, 1996 [JP] Japan .................................. 8-349558

[51] Int. Cl.$^7$ ................................ B32B 7/12; C09J 7/02; C09J 179/08; H01L 23/29
[52] U.S. Cl. ..................... 428/41.5; 428/41.9; 428/212; 428/349; 428/352; 428/355 CN; 428/355 N; 428/447; 428/473.5; 528/26
[58] Field of Search ................................. 428/41.5, 41.9, 428/212, 349, 352, 355 CN, 355 N, 447, 473.5; 528/26

[56] References Cited

U.S. PATENT DOCUMENTS

| | | | |
|---|---|---|---|
| 5,851,616 | 12/1998 | Oka et al. | 428/41.8 |
| 5,866,250 | 2/1999 | Oka et al. | 428/355 CN |
| 5,891,540 | 4/1999 | Oka | 428/40.1 |

FOREIGN PATENT DOCUMENTS

| | | |
|---|---|---|
| 6-291152 | 10/1994 | Japan . |
| 6-291236 | 10/1994 | Japan . |
| 8-325533 | 12/1996 | Japan . |
| 9-67559 | 3/1997 | Japan . |

*Primary Examiner*—Nathan M. Nutter
*Attorney, Agent, or Firm*—McDermott, Will & Emery

[57] ABSTRACT

This invention provide an adhesive tape and a liquid adhesive for electronic parts having sufficient thermal resistance and reliability. The adhesive tape comprises adhesive layers composed of at least a polyimide comprising the repeating units represented by the formulas (1) and (2) on both sides of the substrate, one of said adhesive layer having a higher glass transition temperature than that of the other adhesive layer:

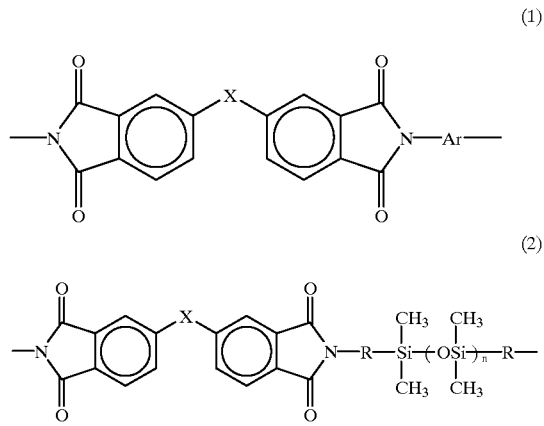

wherein X is —SO$_2$— and/or —C(=O)—OCH$_2$CH$_2$O—C(=O)—,

Ar is a divalent group containing aromatic rings, and R is an alkylene group having 1 to 10 carbon atoms or —CH$_2$OC$_6$H$_4$—, and n means an integer of 1 to 20.

The stustrate may be a resin layer composed of the above mentioned polyimide.

9 Claims, 2 Drawing Sheets

ADHESIVE TAPE FOR ELECTRONIC PARTS

BACKGROUND OF THE INVENTION

1) Field of the Invention

The present invention relates to adhesive tapes for electronic parts to be used for adhering between parts around leadframes making up a semiconductor device, e.g., lead pins, semiconductor chip mounted substrates, heat spreader, semiconductors themselves.

2) Description of the Related Art

Conventionally, adhesive tapes for fixing a leadframe, TAB tapes, etc., are used as adhesive tapes for use in the interior of resin-molded type semiconductor devices. For example, the adhesive tapes for fixing a leadframe have been used to fix lead pins of the leadframe in order to enhance the efficiency for producing the leadframe itself and the whole semiconductor assembly stages. In general, a leadframe manufacturer tapes a leadframe, and brings it to a semiconductor manufacturer, at which a semiconductor chip is mounted thereon followed by molding the leadframe with a resin. For this reason, it has been required for the adhesive tapes for fixing the leadframe not only to possess general reliability in a level required for semiconductor and enough processability at the time of taping, but also to possess sufficient adhesive strength at room temperature immediately after taping and heat resistance enough for withstanding thermal process at the stages of assembling semiconductor devices.

Conventionally, the adhesive tapes for use in such an application include adhesive tapes applying on a support film of a polyimide film, etc., an adhesive comprising polyacrylonitrile, polyacrylate or a synthetic rubber resin such as acrylonitrile-butadiene copolymer solely, or modified with any other resin or blended with any other resin to come into a B-stage.

In recent years, resin-molded type semiconductor devices as shown in FIGS. 1 to 3 have been developed or produced. In FIG. 1, the device has a construction in which lead pins 3 and plane 2 are connected by means of an adhesive layer 6, a semiconductor chip 1 is mounted on the plane 2, and together with bonding wires 4 between the semiconductor chip 1 and the lead pins 3, they are molded with a resin 5. In FIG. 2, the device has a construction in which the lead pins 3 on the leadframe are fixed with the semiconductor chip 1 and an adhesive layer 6 and together with a bonding wire 4, they are molded with a resin 5. In FIG. 3, the device has a construction in which a semiconductor chip 1 is mounted on a die pad 7, an electrode 8 is fixed with an adhesive layer 6, the spaces between semiconductor chip 1 and the electrode 8 and between the electrode 8 and lead pins 3 are each connected with bonding wires 4, and they are molded with a resin 5.

In the adhesive layer in the resin-molded type semiconductor devices shown in FIGS. 1 to 3, the use of an adhesive tape to which a conventional adhesive is applied has the problems that the generated gas stains the lead to cause deterioration of the adhesive strength or causes generation of package crack, because of insufficient heat resistance. It is therefore required to develop adhesives for electronic parts having sufficient heat resistance and reliability and adhesive tapes for electronic parts using them.

The present inventor has solved before the above problems by inventing adhesive tapes using an adhesive containing a polyimide composed of repeating units represented by the below-described formulas (1a) and (2b). (Japanese Patent Application Laid-open Nos. 325533/1996 and 67559/1997).

These adhesive tapes however have various problems. For example, in the semiconductor device having a structure shown in FIG. 2, a punched adhesive tape is adhered to lead pins 3 and then the semiconductor chip is allowed to adhere thereto. In such a case, since an adhesive having the same glass transition temperature is used on the other side of the tape, there is a problem that the adhesive on the side of the lead pins 3 softens at adhesion temperature of the semiconductor chip 1 to cause distortion or movement of the lead pins 3, and consequently the products can not be used because of shorting. The adhesion to the lead pins 3 is capable of carrying out by heating the lead pins 3 at a temperature of 80° C. higher than the glass transition temperature, but there is the possibility of damaging the semiconductor chip, because the adhesion requires much time or pressure under heating the lead pins 3 to the above-mentioned temperature. The same problem is caused on adhesive tapes composed of a monolayer of thermoplastic polyimide. Furthermore, in case of using the monolayer adhesive tapes, processing thereof becomes difficult, because the distortion of the lead pins by thermal expansion is easily caused in the heating stage because of not having the supporting film.

In the semiconductor device shown in FIG. 1 or FIG. 3 in which the semi-conductor chip is not directly bonded to the lead pins, there are two stages of bonding with heat under pressure. Therefore, there is a problem that the distortion or movement of the lead pins is caused because of softening of the adhesive when the second bonding stage is carried out at the same temperature as in the first bonding stage.

Japanese Patent Application Laid-open No. 291236/1994 discloses a method of bonding heat radiator to the lead frame in the semiconductor device with an adhesive tape comprising polyimide adhesive layers having each a different glass transition temperature (Tg). However, there is no detailed description concerning components of the adhesive to be used. Generally, resins which have the same Tg show different behavior one another under a higher temperature than Tg, when the components or molecular weights thereof are different one another, even though having the same Tg. Accordingly, sufficient reliability is by no means obtainable in the adhesive for electronic parts, when the adhesive tape is produced by merely laminating resins having each a different Tg. Japanese Patent Application Laid-open No. 291152/1994 discloses the same adhesive layer as described above. However, there is no detailed description about the components of the adhesive to be used, but only discloses that combinations of resins such as polyimide, polyetherimide, polyetheramide imide, etc. can be used. However, such combinations have the problem that they easily cause interlayer separation by accumulation of strains suffered in the production stages for electronic parts, because adhesive properties of such combination of resins having each a different molecular structure are not always excellent.

The present invention has been made for the purpose of solving such problems in the prior arts. Namely, an object of the present invention is to provide adhesive tapes for electronic parts capable of adhesion at a relatively low temperature, with keeping electrical insulation and having sufficient reliability.

SUMMARY OF THE INVENTION

The adhesive tapes for electronic parts of the present invention comprise two adhesive layers provided on both sides of a substrate. An adhesive tape for electronic parts of the first aspect in the present invention is characterized by comprising two adhesive layers which are resin layers composed of 100–40% by mol of at least a polyimide comprising at least one of the repeating units represented by the following formulas (1a) and (1b) and 0–60% by mol of at least one of the repeating units represented by the following formulas (2a) and (2b), said two adhesive layers having each a different glass transition temperature:

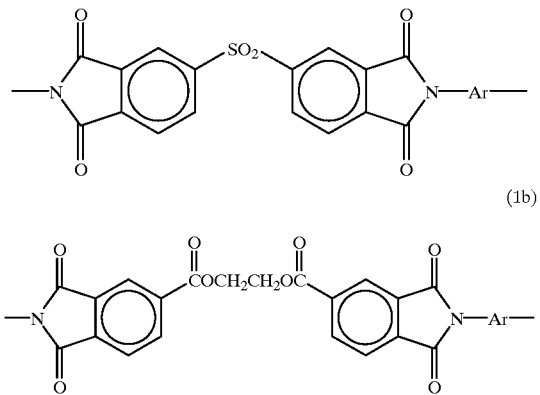

wherein Ar represents a divalent group selected from the following formulas containing aromatic rings:

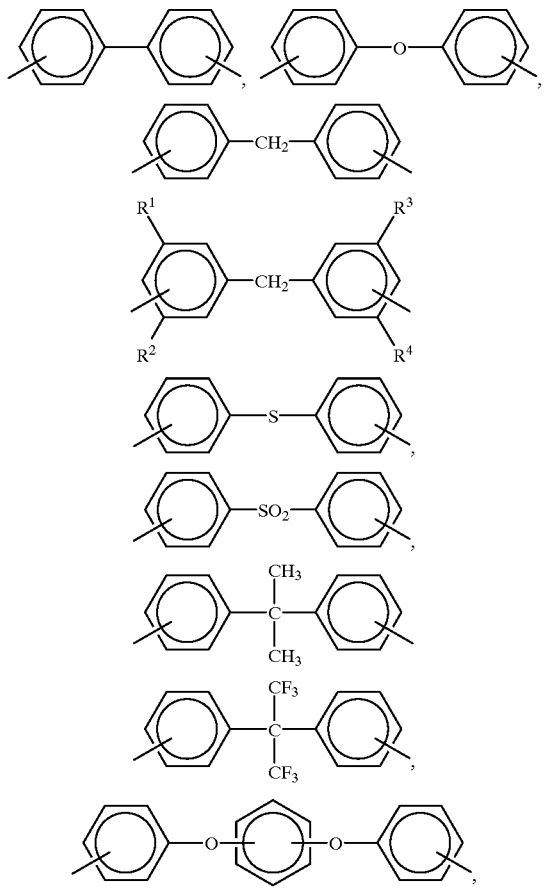

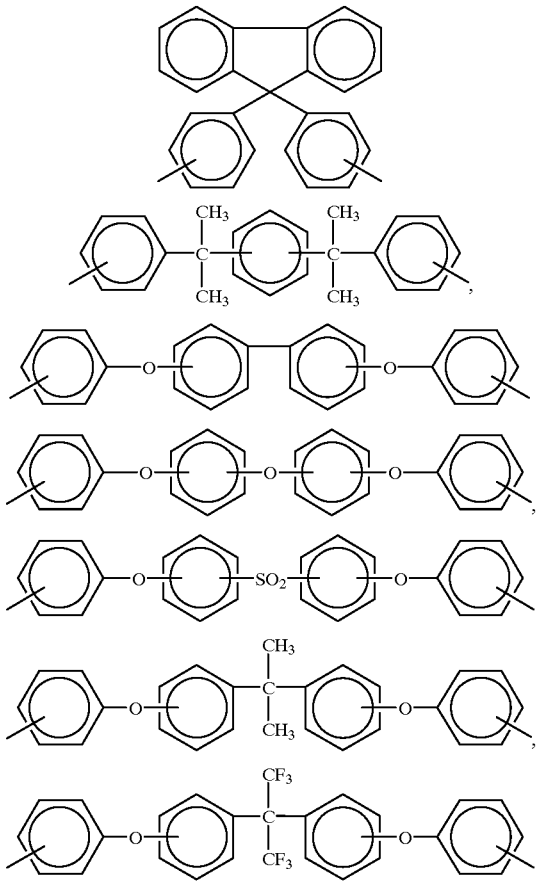

wherein $R_1$, $R_2$, $R_3$ and $R_4$ which may be identical or different represent each a hydrogen atom, an alkyl group having 1–4 carbon atoms or an alkoxy group having 1–4 carbon atoms, provided that $R_1$, $R_2$, $R_3$ and $R_4$ are not hydrogen atoms at the same time.

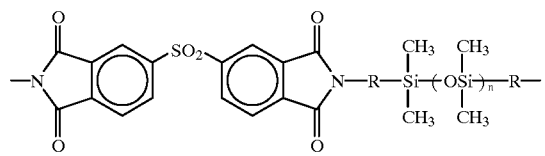

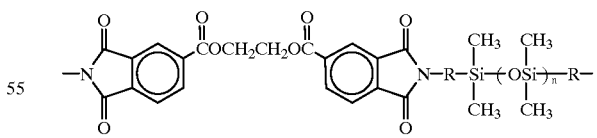

wherein R is an alkylene group having 1 to 10 carbon atoms or —$CH_2OC_6H_4$—, the methylene group of which attaches to Si, and n means an integer of 1 to 20.

An adhesive tape for electronic parts of the second aspect in the present invention is characterized by that the substrate and two adhesive layers are resin layers composed of 100–40% by mol of at least a polyimide comprising at least one of the repeating units represented by the above mentioned formulas (1a) and (1b) and 0–60% by mol of at least one of the repeating units represented by the above mentioned formulas (2a) and (2b), said substrate being the resin layer having the highest glass transition temperature of all resin layers.

It is preferred in the adhesive tape of the second aspect that the glass transition temperature of the substrate is at least 40° C. higher than that of both adhesive layers and the glass transition temperature of one of adhesive layers is the same as or higher than that of the other adhesive layer.

In the adhesive tapes for electronic parts of the first aspect and the second aspect of the present invention, it is preferred that at least one of the adhesive layers contains a filler having a particle size of not more than 1 μm in an amount of from 0.1 to 50 % by weight and it is possible to provide a releasing film on a surface of at least one of the adhesive layers.

DETAILED DESCRIPTION OF PREFERRED EMBODIMENTS

Figure 1:
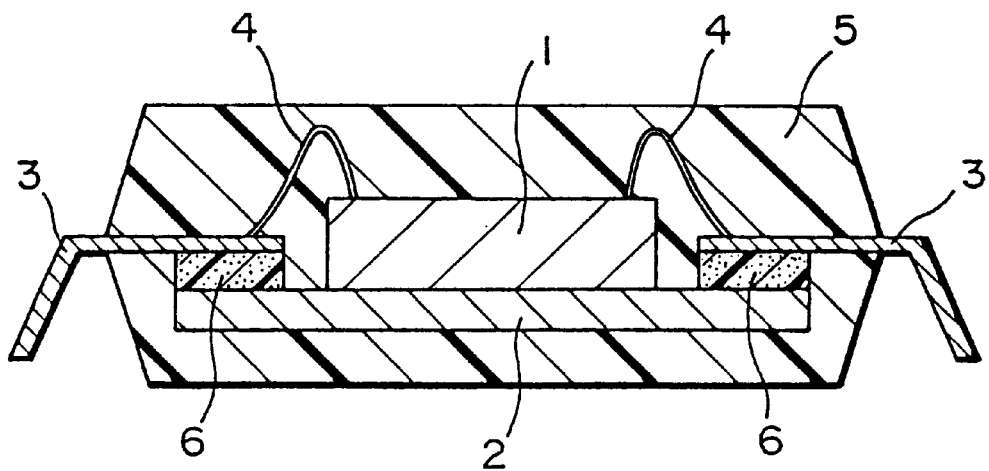
FIG. 1 is a cross-sectional view of one embodiment of a resin-molded type semiconductor device using an adhesive tape of the present invention or a conventional adhesive tape.

The embodiments of the present invention will now be described in detail.

The adhesive tapes for electronic parts of the present invention have the adhesive layer A1 and the adhesive layer A2 on both sides of the substrate B, wherein the adhesive layer A1 and the adhesive layer A2 are resin layers comprising at least one polyimnide. In the adhesive tape for electronic parts of the second aspect, the substrate B is also the resin layer comprising similar polyimide. In the following, polyimides used for these resin layers are illustrated.

The polyimides used in the present invention are those which contain 100–40% by mol of at least one of repeating units represented by the following formulas (1a) and (1b). In this case, the polyimide contains "at least one of the repeating units represented by the formulas (1a) and (1b)" includes polyimides containing the repeating unit represented by the formula (1a) alone, polyimides containing the repeating unit represented by the formula (1b) alone, and polyimides containing both the repeating units represented by the formulas (1a) and (1b).

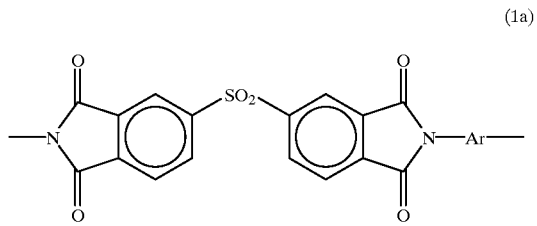

(1a)

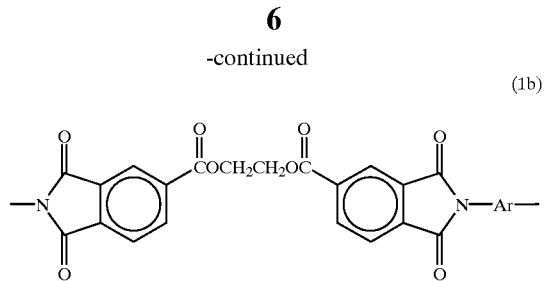

(1b)

wherein Ar represents a divalent group selected from the following formulas containing aromatic rings:

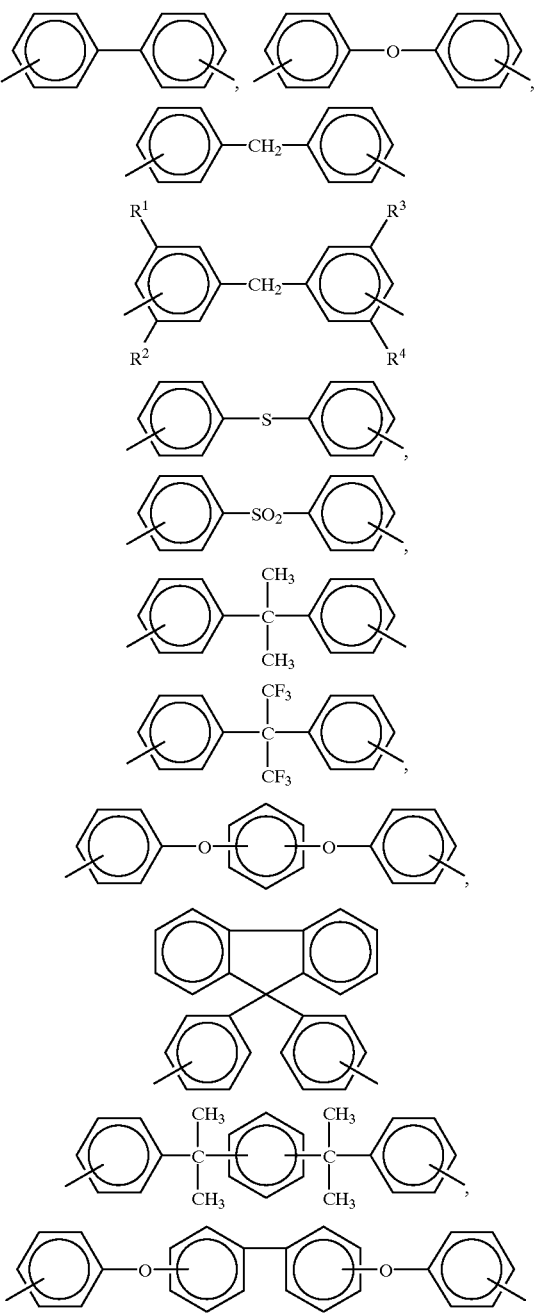

-continued

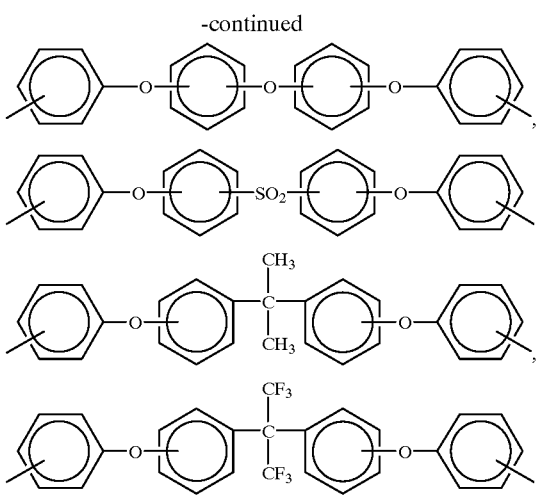

wherein $R_1$, $R_2$, $R_3$ and $R_4$ which may be identical or different represent each a hydrogen atom, an alkyl group having 1–4 carbon atoms or an alkoxy group having 1–4 carbon atoms, provided that $R_1$, $R_2$, $R_3$ and $R_4$ are not hydrogen atoms at the same time.

The polyimides used in the present invention are those which contain 0–60% by mol of at least one of repeating units represented by the following formulas (2a) and (2b). In this case, the polyimide contains "at least one of the repeating units represented by the formulas (2a) and (2b)" includes polyimides containing the repeating unit represented by the formula (2a) alone, polyimides containing the repeating unit represented by the formula (2b) alone, and polyimides containing both the repeating units represented by the formulas (1a) and (1b).

(2a)

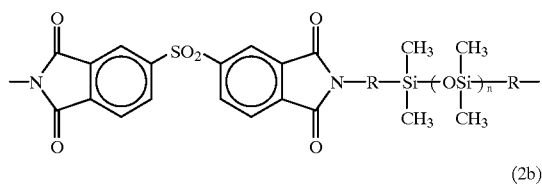

(2b)

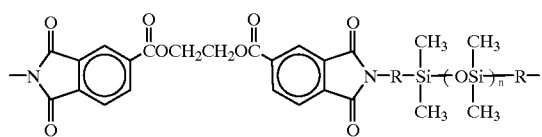

wherein R is an alkylene group having 1 to 10 carbon atoms or —$CH_2OC_6H_4$—, the methylene group of which attaches to Si, and n means an integer of 1 to 20.

In the above described polyimide, the greater the proportion of the repeating units represented by the formulas (1a) and (1b) (referred to as [(1a)+(1b)] herein after) is, the higher the glass transition temperature becomes, while the greater the proportion of the repeating units represented by the formulas (2a) and (2b) (referred to as [(2a)+(2b)] herein after) is, the lower the glass transition temperature becomes. Accordingly, it is possible to control a temperature capable of adhering the adhesive by controlling glass transition temperature of the polyimide.

Accordingly, a preferred polyimide used in the present invention comprises from 100 to 40 mol % of at least one of the repeating units represented by the above formulas (1a) and (1b) and from 0 to 60 mol % of at least one of the repeating units represented by the above formulas (2a) and (2b), which has a number average molecular weight of from 4,000 to 200,000.

Regarding solubility of the above mentioned polyimide, it is greatly influenced by the proportion of [(2a)+(2b)] in the polyimide. When the proportion of it is lower than 5 % by mol, the polyimide is soluble in only amide solvents.

Accordingly, in the case that the substrate B is the resin layer composed of the above mentioned polyimide, polyimide resins which are rich in the structure: [(2a)+(2b)] are used for the adhesive layers A1 and A2, while polyimide resins which are rich in the structure: [(1a)+(1b)] are used for the substrate B.

In the adhesive tape for electronic parts of the first aspect of the present invention, it is necessary to have the relation of $Tg_{A1} > Tg_{A2}$ and is preferred to have the relation of $Tg_{A1} > Tg_{A2}+30$. In the adhesive tape for electronic parts of the second aspect of the present invention, it is necessary to have the relations of $Tg_B > Tg_{A1}$ and $Tg_B > Tg_{A2}$ and is preferred to satisfy the relations of $Tg_B \geq Tg_{A1}+40$, $Tg_B \geq Tg_{A2}+40$ and $Tg_{A1} \geq Tg_{A2}$, wherein "$Tg_{A1}$" is glass transition temperature (°C.) of the adhesive layer A1, "$Tg_{A2}$" is that of the adhesive layer A2, and "$Tg_B$" is that of the substrate B.

The above polyimides to be used in the present invention can be produced according to conventional processes for producing polyimides. In concrete, they can be produced from tetracarboxylic dianhydrides corresponding to the desired repeating units and diamines or diisocyanates corresponding to the desired repeating unit.

Typically, the above polyimide can be produced by reacting tetracarboxylic dianhydrides represented by the following formula (3a) and/or (3b) with a compound represented by the following formula (4) and/or a siloxane compound represented by the following formula (5).

(3a)

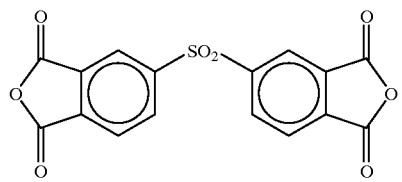

(3b)

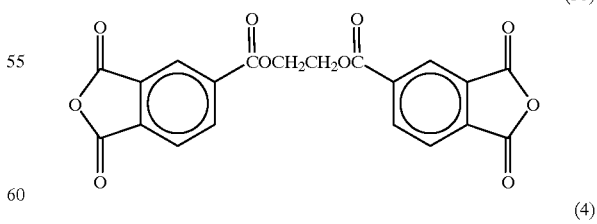

(4)

Y—Ar—Y wherein Ar represents a divalent group selected from the above mentioned structures containing aromatic rings and Y is an amino group or an isocyanate group.

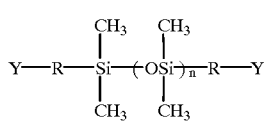

(5)

wherein R is an alkylene group having 1 to 10 carbon atoms or —CH$_2$OC$_6$H$_4$—, the methylene group of which attaches to S1, n means an integer of 1 to 20, and Y is an amino group or an isocyanate group.

Examples of tetracarboxylic dianhydrides represented by the formulas (3a) and (3b) which are used as raw materials for producing the polyimide and form the basic construction of them are 3,3',4,4'-diphenylsulfone-tetracarboxylic dianhydride and ethylene glycol bistrimellitate dianhydride, respectively.

Examples of the compound represented by the formula (4) include those wherein Ar is a divalent group selected from the above mentioned formulas having aromatic rings. Typical examples of the compound wherein the functional group Y is an amino group include the following diamines: 3,3'-diaminobiphenyl, 3,4'-diaminobiphenyl, 4,4'-diaminobiphenyl, 3,3'-diaminodiphenylmethane, 3,4'-diaminodiphenylmethane, 4,4'-diaminodiphenylmethane, 2,2-(3,3'-diaminodiphenyl)propane, 2,2-(3,4'-diaminodiphenyl)propane, 2,2-(4,4'-diaminodiphenyl)propane, 2,2-(3,3'-diaminodiphenyl)hexafluoropropane, 2,2-(3,4'-diaminodiphenyl)hexafluoropropane, 2,2-(4,4'-diaminodiphenyl)hexafluoropropane, 3,3'-oxydianiline, 3,4'-oxydianiline, 4,4'-oxydianiline, 3,3'-diaminodiphenyl sulfide, 3,4'-diaminodiphenyl sulfide, 4,4'-diaminodiphenyl sulfide, 3,3'-diaminodiphenyl sulfone, 3,4'-diaminodiphenyl sulfone, 4,4'-diaminodiphenyl sulfone, 1,3-bis[1-(3-aminophenyl)-1-methylethyl]benzene, 1,3-bis[1-(4-aminophenyl)-1-methylethyl]benzene, 1,4-bis[1-(3-aminophenyl)-1-methylethyl]benzene, 1,4-bis[1-(4-aminophenyl)-1-methylethyl]benzene, 1,3-bis(3-aminophenoxy)benzene, 1,3-bis(4-aminophenoxy)benzene, 1,4-bis(3-aminophenoxy)benzene, 1,4-bis (4-aminophenoxy)benzene, 3,3'-bis(3-aminophenoxy)diphenyl ether, 3,3'-bis(4-aminophenoxy)diphenyl ether, 3,4'-bis(3-aminophenoxy)diphenyl ether, 3,4'-bis(4-aminophenoxy)diphenyl ether, 4,4'-bis(3-aminophenoxy)diphenyl ether, 4,4'-bis(4-aminophenoxy)diphenyl ether, 3,3'-bis(3-aminophenoxy)biphenyl, 3,3'-bis(4-aminophenoxy)biphenyl, 3,4'-bis(3-aminophenoxy)biphenyl, 3,4'-bis (4 -aminophenoxy)biphenyl, 4,4'-bis(3-aminophenoxy)biphenyl, 4,4'-bis (4-aminophenoxy)biphenyl, bis[4-(3-aminophenoxy)phenyl]sulfone, bis[4-(4-aminophenoxy)phenyl]sulfone, 2,2-bis[3-(3-aminophenoxy)phenyl]propane, 2,2-bis[3-(4-aminophenoxy)phenyl]propane, 2,2-bis[4-(3-aminophenoxy)phenyl]propane, 2,2-bis[4-(4-aminophenoxy)phenyl]propane, 2,2-bis[3-(3-aminophenoxy)phenyl]hexafluoropropane, 2,2-bis[3-(4-aminophenoxy)phenyl]hexafluoropropane, 2,2-bis[4-(3-aminophenoxy)phenyl]hexafluoropropane, 2,2-bis[4-(4-aminophenoxy)phenyl]hexafluoropropane, 9,9-bis(3-aminophenyl)fluorene, 9,9-bis(4-aminophenyl)fluorene, 3,3'-diamino-2,2',4,4'-tetramethyldiphenylethane, 3,3'-diamino-2,2',4,4'-tetraethyldiphenylmethane, 3,3'-diamino-2,2',4,4'-tetrapropyldiphenylmethane, 3,3'-diamino-2,2',4,4'-tetraisopropyldiphenylmethane, 3,3'-diamino-2,2',4,4'-tetrabutyldiphenylmethane, 3,4'-diamino-2,3',4,5'-tetramethyldiphenylmethane, 3,4'-diamino-2,3',4,5'-tetraethyldiphenylmethane, 3,4'-diamino-2,3',4,5'-tetrapropyldiphenylmethane, 3,4'-diamino-2,3',4,5'-tetraisopropyldiphenylmethane, 3,4'-diamino-2,3',4,5'-tetrabutyldiphenylmethane, 4,4'-diamino-3,3',5,5'-tetramethyldiphenylmethane, 4,4'-diamino-3,3',5,5'-tetraethyldiphenylmethane, 4,4'-diamino-3,3',5,5'-tetrapropyldiphenylmethane, 4,4'-diamino-3,3',5,5'-tetraisopropyldiphenylmethane, 4,4'-diamino-3,3',5,5'-tetrabutyldiphenylmethane, 4,4'-diamino-3,3'-diethyl-5,5'-dimethyldiphenylmethane, 4,4'-diamino-3,3'-dimethyldiphenylmethane, 4,4'-diamino-3,3'-diethyldiphenylmethane, 4,4'-diamino-3,3',5,5'-tetramethoxydiphenylmethane, 4,4'-diamino-3,3',5,5'-tetraethoxydiphenylmethane, 4,4'-diamino-3,3',5,5'-tetrapropoxydiphenylmethane, 4,4'-diamino-3,3',5,5'-tetraisopropoxydiphenylmethane, 4,4'-diamino-3,3',5,5'-tetrabutoxydiphenylmethane, 4,4'-diamino-3,3'-dimethoxydiphenylmethane, 4,4'-diamino-3,3'-diethoxydiphenylmethane and the like.

Examples of diisocyanates which are the compounds represented by the formula (4) wherein the functional group Y is an isocyanate group include those exemplified in the above mentioned diamines in which "amino" is replaced by "isocyanate".

Examples of the diamines in the compounds represented by the formula (5) wherein the functional group Y is an amino group include bis(3-aminopropyl) tetramethyldisiloxane, bis(10-aminodecamethylene) tetramethyldisiloxane, tetramer and octamer of dimethylsiloxane having aminopropyl at the terminal, bis(3-aminophenoxymethyl)tetramethyldisiloxane, etc. They can be used as a mixture. Examples of the diisocyanates in the compounds represented by the formula (5) wherein the functional group Y is an isocyanate include those exemplified in the above diamines wherein "amino" is replaced by "isocyanate".

The diusocyanates wherein the functional group Y in the above mentioned formulas (4) and (5) is an isocyanate group can be easily produced by reacting the above exemplified corresponding diamine with phosgene.

The polyimides of the present invention can be produced as follows.

Examples of processes for producing the polyimide using tetracarboxylic dianhyrides and diamines as the raw materials for the polyimide include the following. A process for directly obtaining a polyimide by heating a tetracarboxylic dianhyrides and diamines in an organic solvent, optionally in the presence of a catalyst (in an amount of not more than 20 parts by weight of the reactants) such as tributylamine, triethylamine, or triphenyl phosphate to a temperature of not less than 100° C., and preferably not less than 180° C.; and a process for obtaining a polyimide by reacting tetracarboxylic dianhyrides with diamines in an organic solvent at a temperature of not more than 100° C. to obtain a polyamic acid which is a precursor of the polyimide, optionally adding a dehydrating such as p-toluenesulfonic acid (in an amount of 1 to 5 times the mol of the tetracarboxylic dianhydride), and then heating the solution to cause an imidation. A process in which the above-mentioned polyamic acid is caused to a ring closing reaction at a relatively low temperature (in a range from room temperature to 100° C.) by adding dehydrating ring closing agent such as an anhydride, e.g., acetic anhydride, propionic anhydride or benzoic anhydride, a carbodiimide compound, e.g., dicylohexylcarbodiimide, and optionally a ring closing catalyst such as pyridine, isoquinoline, imidazole and triethylamine (as for the dehydrating ring closing agent and ring closing catalyst, in an amount of 2 to 10 times the mol of the tetracarboxylic dianhydride).

Examples of the organic solvents used in these reactions include aprotic polar solvents such as N-methyl-2-pyrrolidone, N,N-dimethylacetamide, N,N-dimethylformamide, dimethylsulfoxide, sulforane, hexamethylphosphoric acid triamide, and 1,3-dimethyl-2-imidazolidone, and phenolic solvents such as phenol, cresol, xylenol, and p-chlorophenol. Optionally, solvents such as benzene, toluene, xylene, methyl ethyl ketone, acetone, tetrahydrofuran, dioxane, monoglyme, diglyme, triglyme, methyl cellosolve, cellosolve acetate, methanol, ethanol, isopropanol, methylene chloride, chloroform, trichloroethylene, and nitrobenzene can be mixed with the above-mentioned solvents as a mixture.

In the case where tetracarboxylic dianhydrides and diisocyanates are used as the raw materials, the product can be produced according to the above-mentioned process for directly obtaining a polyimide. In this case, the reaction temperature is preferably not less than room temperature, and particularly not less than 60° C. The polyimide having a high polymerization degree can be produced by the reaction between equimolar amounts of the tetracarboxylic dianhydrides and the diamines or diisocyanates. If necessary, either of them is capable of using in an excess amount of less than 10% by mol.

Since the film formability depends upon molecular weight of the polyimide used in the present invention, the molecular weight can be optimally decided according to desired film formability. When being used for the adhesive layers A1 and A2 in the present invention, polyimide having too low molecular weight is not preferred because film formability in some degree is required in the adhesive layer even in the case of the liquid form and the heat resistance is also lowered. In the present invention, the number average molecular weight of polyimide is required to be not less than 4,000. When being used as a thermoplastic adhesive, the adhesion is changed for the worse, if the viscosity during the melting is too high. Since the molecular weight is a factor for controlling the viscosity during the melting, the polyimide used in the present invention should have number average molecular weight of approximately not more than 400,000. If the molecular weight is higher than this value, there is a high increase in the viscosity making it difficult to be used as an adhesive. When being used for the substrate B, the polyimide is required to have the same or superior film formability to the above-mentioned adhesive layers and to have an number average molecular weight of approximately higher than 10000, because it is easily used if being hard to melt by exposing to a high temperature.

In present invention, though the above mentioned polyimides are used alone in two adhesive layers, two or more kinds selected from the above described polyimides may be suitably mixed in order to control the glass transition temperature (Tg).

The adhesive tapes for electronic parts of the present invention can be produced by film formation of the polyimide or laminating them according to known methods. Film formation of the polyimide can be carried out by, for example, a process which comprises applying a coating solution containing polyimide to one side of a heat-resistant film which is the substrate, followed by drying to form the first adhesive layer, and then applying a coating solution containing polyimide having the same or different Tg to the other side of the heat-resistant film, followed by drying to form the second adhesive layer. The other film forming processes can be utilized for formation of the resin layers. The laminating of the polyimide films can be carried out by, for example, a process which comprises pressing three films having each a different Tg with heating. It is also possible to utilize a process which comprises applying a coating solution for the first adhesive layer to a surface of a releasing film, drying to form a film, applying a coating solution for the substrate to the resultant film, followed by drying to form the substrate, and then applying a coating solution for the second adhesive layer and drying, and a process which comprises applying three kinds of the coating solutions simultaneously and drying.

In the adhesive tapes for electronic parts of the present invention, the whole thickness which can be suitably varied is generally in a range of 10–150 $\mu$m, and each layer has a thickness of 5 $\mu$m or more so as to have tolerable adhesive strength.

In order to form the adhesive layer by application, a polyimide coating varnish obtained by dissolving the above described polyimide in a suitable solvent is used. Examples of the organic solvents used for dissolving the polyimide include various organic solvents such as aprotic polar solvents, e.g., N-methyl-2-pyrrolidone, N,N-dimethylacetamide, N,N-dimethylformamide, dimethylsulfoxide, sulforane, hexamethylphosphoric acid triamide, and 1,3-dimethyl-2-imidazolidone, phenol solvents such as phenol, cresol, xylenol and p-chlorophenol, etc., isophorone, cyclohexanone, carbitol acetate, diglyme, dioxane, tetrahydrofuran, etc. Moreover, alcoholic solvents such as methanol, ethanol and isopropanol, ester solvents such as methyl acetate, ethyl acetate and butyl acetate, nitrile solvents such as acetonitrile and benzonitrile, aromatic solvents such as benzene, toluene and xylene, halogen solvents such as chloroform and dichloromethane, and the like can be mixed and used in such a degree that the polyimide is not separated.

It is preferred to suitably control concentration and viscosity of the polyimide coating varnish according to the applications.

In the two adhesive layers of the present, a filler having a particle size of not more than 1 $\mu$m may be incorporated for the purpose of controlling characteristics during the adhering. The content of the filler when being incorporated is preferably from 0.1 to 50% by weight, and more preferably from 4 to 25% by weight, based on the total solid content. If the content of the filler exceeds 50% by weight, the adhesion strength is remarkably lowered. Conversely, if it is less than 0.1% by weight, no effect of the addition of the filler can be obtained.

Examples of the fillers which can be used are silica, quarts powder, mica, alumina, diamond powder, zircon powder, calcium carbonate, magnesium oxide, fluorine containing resin, and the like.

The release film used in the present invention serves as a temporary base, which has a thickness of from 1 to 200 $\mu$m. Typical examples of the release film used include resin films made of polyethylene, polypropylene, fluorine containing resin, polyethylene terephthalate, polyimide, etc. and paper, and those the surface of which is subjected to releasing treatment with a silicone releasing agent.

In the adhesive tape of the present invention, it is possible to provide on the formed adhesive layer the above-mentioned release film as a protective layer.

As is clear from the results of examination shown hereafter, the adhesive tapes for electronic parts of the present invention have remarkably high reliability for adhering electronic parts, because of having sufficient heat resistance and adhesive strength. The adhesive tapes of the present invention can be suitably used for adhering between parts around leadframes making up a semiconductor device, for example, lead pins, semiconductor-mounted substrate, heat spreader, and semiconductor chips themselves, and the adhesive tapes for electronic parts of the present invention can suitably be used as adhesive tapes for the innerlead fix of the leadframe and as TAB tapes, etc.

EXAMPLE

The present invention will now be described in greater detail. First, examples for producing polyimides and coating varnishes containing polyimide used in the present invention shown.

Synthetic Example 1

Into a flask equipped with a stirrer were introduced 12.34 g (67 mmol) of 3,4'-diaminobiphenyl, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone at an iced temperature, and stirring was continued for 1 hour. Consequently, the solution was reacted at room temperature for 3 hours to synthesize a polyamic acid. To the resulting polyamic acid were added 50 ml of toluene and 1.0 g of p-toluenesulfonic acid, the mixture was heated to 160° C., and an imidation reaction was carried out for 3 hours while separating water which was flowed by being azeotropically distilled with toluene. After toluene was distilled off, the resulting polyimide varnish was poured in methanol, followed by separation of the resulting precipitate, pulverization, washing, and drying to obtain 50.0 g (yield: 95%) of a polyimide composed of the above mentioned repeating units in a proportion of [(1a)+(1b)]:[(2a)+(2b)]=67:33 wherein (1a):(1b)=100:0 and (2a):(2b)=100:0.

The IR spectrum measurement of the resultant polyimide showed typical absorption bands of imide at 1718 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 2

Using 13.41 g (67 mmol) of 4,4'-oxydianiline, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=67:33 wherein (1a):(1b)=100:0 and (2a):(2b)=100:0 was obtained in an amount of 51.0 g (yield: 95%) by the same manner as in Synthetic Example 1.

The IR spectrum measurement of the resultant polyimide showed typical absorption bands of imide at 1718 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 3

Using 13.29 g (67 mmol) of 4,4'-diaminodiphenylmethane, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=67:33 wherein (1a):(1b)=100:0 and (2a):(2b)=100:0 was obtained in an amount of 52.0 g (yield: 97%) by the same manner as in Synthetic Example 1.

The IR spectrum measurement of the resultant polyimide showed typical absorption bands of imide at 1718 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 4

Using 14.49 g (67 mmol) of 4,4'-diaminodiphenyl sulfide, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=67:33 wherein (1a):(1b)=100:0 and (2a):(2b)=100:0 was obtained in an amount of 51.0 g (yield: 93%) by the same manner as in Synthetic Example 1.

The IR spectrum measurement of the resultant polyimide showed typical absorption bands of imide at 1718 cm$^{-1}$ and 1780 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 5

Using 16.64 g (67 mmol) of 3,3'-diaminodiphenyl sulfone, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=67:33 wherein (1a):(1b)=100:0 and (2a):(2b)=100:0 was obtained in an amount of 51.5 g (yield: 90%) by the same manner as in Synthetic Example 1.

The IR spectrum measurement of the resultant polyimide showed typical absorption bands of imide at 1715 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 6

Using 15.16 g (67 mmol) of 2,2-bis(4-aminophenyl) propane, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=67:33 wherein (1a):(1b)=100:0 and (2a):(2b)=100:0 was obtained in an amount of 54.0 g (yield: 97%) by the same manner as in Synthetic Example 1.

The IR spectrum measurement of the resultant polyimide showed typical absorption bands of imide at 1718 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 7

Using 22.40 g (67 mmol) of 2,2-bis(4-aminophenyl) hexafluoropropane, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=67:33 wherein (1a):(1b)=100:0 and (2a):(2b)=100:0 was obtained in an amount of 60.0 g (yield: 95%) by the same manner as in Synthetic Example 1.

The IR spectrum measurement of the resultant polyimide showed typical absorption bands of imide at 1721 $cm^{-1}$ and 1783 $cm^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 8

Using 19.58 g (67 mmol) of 1,4-bis(4-aminophenoxy) benzene, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=67:33 wherein (1a):(1b)=100:0 and (2a):(2b)=100:0 was obtained in an amount of 58.0 g (yield: 97%) by the same manner as in Synthetic Example 1.

The IR spectrum measurement of the resultant polyimide showed typical absorption bands of imide at 1718 $cm^{-1}$ and 1780 $cm^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 9

Using 19.58 g (67 mmol) of 1,3-bis(4-aminophenoxy) benzene, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=67:33 wherein (1a):(1b)=100:0 and (2a):(2b)=100:0 was obtained in an amount of 58.0 g (yield: 97%) by the same manner as in Synthetic Example 1.

The IR spectrum measurement of the resultant polyimide showed typical absorption bands of imide at 1718 $cm^{-1}$ and 1780 $cm^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 10

Using 23.08 g (67 mmol) of 1,3-bis[1-(4-aminophenyl)-1-methylethyl]benzene, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=67:33 wherein (1a):(1b)=100:0 and (2a):(2b)=100:0 was obtained in an amount of 62.5 g (yield: 98%) by the same manner as in Synthetic Example 1.

The IR spectrum measurement of the resultant polyimide showed typical absorption bands of imide at 1718 $cm^{-1}$ and 1783 $cm^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 11

Using 24.68 g (67 mmol) of bis(4-aminophenoxy) biphenyl, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=67:33 wherein (1a):(1b)=100:0 and (2a):(2b)=100:0 was obtained in an amount of 64.0 g (yield: 98%) by the same manner as in Synthetic Example 1.

The IR spectrum measurement of the resultant polyimide showed typical absorption bands of imide at 1718 $cm^{-1}$ and 1780 $cm^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 12

Using 25.75 g (67 mmol) of bis(4-aminophenoxy) diphenyl ether, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=67:33 wherein (1a):(1b)=100:0 and (2a):(2b)=100:0 was obtained in an amount of 64.0 g (yield: 97%) by the same manner as in Synthetic Example 1.

The IR spectrum measurement of the resultant polyimide showed typical absorption bands of imide at 1718 $cm^{-1}$ and 1783 $cm^{-1}$, The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 13

Using 28.98 g (67 mmol) of bis[4-(4-aminophenoxy) phenyl]sulfone, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=67:33 wherein (1a):(1b)=100:0 and (2a):(2b)=100:0 was obtained in an amount of 65.0 g (yield: 94%) by the same manner as in Synthetic Example 1.

The IR spectrum measurement of the resultant polyimide showed typical absorption bands of imide at 1719 $cm^{-1}$ and 1785 cm⁻¹. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 14

Using 27.50 g (67 mmol) of 2,2-bis[4-(4-aminophenoxy) phenyl]propane, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=67:33 wherein (1a):(1b)=100:0 and (2a):(2b)=100:0 was obtained in an amount of 65.0 g (yield: 96%) by the same manner as in Synthetic Example 1.

The IR spectrum measurement of the resultant polyimide showed typical absorption bands of imide at 1720 cm⁻¹ and 1783 cm⁻¹. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 15

Using 34.74 g (67 mmol) of 2,2-bis[4-(4-aminophenoxy) phenyl]hexafluoropropane, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=67:33 wherein (1a):(1b)=100:0 and (2a):(2b)=100:0 was obtained in an amount of 74.0 g (yield: 98%) by the same manner as in Synthetic Example 1.

The IR spectrum measurement of the resultant polyimide showed typical absorption bands of imide at 1715 cm⁻¹ and 1786 cm⁻¹. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 16

Using 23.35 g (67 mmol) of 9,9-bis(4-aminophenyl)fluorene, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=67:33 wherein (1a):(1b)=100:0 and (2a):(2b)=100:0 was obtained in an amount of 60.5 g (yield: 95%) by the same manner as in Synthetic Example 1.

The IR spectrum measurement of the resultant polyimide showed typical absorption bands of imide at 1720 cm⁻¹ and 1780 cm⁻¹. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 17

Using 13.82 g (75 mmol) of 3,4'-diaminobiphenyl, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]:[(2a)+(2b)]=75:25 wherein (1a):(1b)=0:100 and (2a):(2b)=0:100 was obtained in an amount of 54.0 g (yield: 94%) by the same manner as in Synthetic Example 1.

The IR spectrum measurement of the resultant polyimide showed typical absorption bands of imide at 1718 cm⁻¹ and 1783 cm⁻¹. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 18

Using 15.02 g (75 mmol) of 4,4'-oxydianiline, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]:[(2a)+(2b)]=75:25 wherein (1a):(1b)=0:100 and (2a):(2b)=0:100 was obtained in an amount of 52.0 g (yield: 89%) by the same manner as in Synthetic Example 1.

The IR spectrum measurement of the resultant polyimide showed typical absorption bands of imide at 1718 cm⁻¹ and 1783 cm⁻¹. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 19

Using 14.87 g (75 mmol) of 4,4'-diaminodiphenylmethane, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide consisting of the repeating units in a proportion of [(1a)+(1b)]:[(2a)+(2b)]=75:25 wherein (1a):(1b)=0:100 and (2a):(2b)=0:100 was obtained in an amount of 55.0 g (yield: 94%) by the same manner as in Synthetic Example 1.

The IR spectrum measurement of the resultant polyimide showed typical absorption bands of imide at 1718 cm⁻¹ and 1783 cm⁻¹. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 20

Using 16.22 g (75 mmol) of 4,4'-diaminodiphenyl sulfide, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]:[(2a)+(2b)]=75:25 wherein (1a):(1b)=0:100 and (2a):(2b)=0:100 was obtained in an amount of 54.0 g (yield: 90%) by the same manner as in Synthetic Example 1.

The IR spectrum measurement of the resultant polyimide showed typical absorption bands of imide at 1718 cm⁻¹ and 1780 cm⁻¹. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 21

Using 18.63 g (75 mmol) of 3,3'-diaminodiphenyl sulfone, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]:[(2a)+(2b)]=75:25 wherein (1a):(1b)=0:100 and (2a):(2b)=0:100 was obtained in an amount of 55.5 g (yield: 89%) by the same manner as in Synthetic Example 1.

The IR spectrum measurement of the resultant polyimide showed typical absorption bands of imide at 1715 cm⁻¹ and 1783 cm⁻¹. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 22

Using 16.97 g (75 mmol) of 2,2-bis(4-aminophenyl)propane, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]:[(2a)+(2b)]=75:25 wherein (1a):(1b)=0:100 and (2a):(2b)=0:100 was obtained in an amount of 57.0 g (yield: 94%) by the same manner as in Synthetic Example 1.

The IR spectrum measurement of the resultant polyimide showed typical absorption bands of imide at 1718 cm⁻¹ and 1783 cm⁻¹. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 23

Using 25.07 g (75 mmol) of 2,2-bis(4-aminophenyl)hexafluoropropane, 6.21 g (25 mmol) of 1,3-bis(3-aminopropyl)-1,1,3,3-tetramethyldisiloxane, 41.03 g (100 mmol) of ethylene glycol bistrimellitate dianhydride and 300 ml of N-methyl-2-pyrrolidone, a polyimide composed of the repeating units in a proportion of [(1a)+(1b)]:[(2a)+(2b)]=75:25 wherein (1a):(1b)=0:100 and (2a):(2b)=0:100 was obtained in an amount of 67.0 g (yield: 98%) by the same manner as in Synthetic Example 1.

The IR spectrum measurement of the resultant polyimide showed typical absorption bands of imide at 1721 cm⁻¹ and 1783 cm⁻¹. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 24

Using 21.92 g (75 mmol) of 1,4-bis(4-aminophenoxy)benzene, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]:[(2a)+(2b)]=75:25 wherein (1a):(1b)=0:100 and (2a):(2b)=0:100 was obtained in an amount of 62.0 g (yield: 95%) by the same manner as in Synthetic Example 1.

The IR spectrum measurement of the resultant polyimide showed typical absorption bands of imide at 1718 cm⁻¹ and 1780 cm⁻¹. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 25

Using 21.92 g (75 mmol) of 1,3-bis(4-aminophenoxy)benzene, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]:[(2a)+(2b)]=75:25 wherein (1a):(1b)=0:100 and (2a):(2b)=0:100 was obtained in an amount of 64.0 g (yield: 97%) by the same manner as in Synthetic Example 1.

The IR spectrum measurement of the resultant polyimide showed typical absorption bands of imide at 1718 cm⁻¹ and 1780 cm⁻¹. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 26

Using 25.84 g (75 mmol) of 1,3-bis[1-(4-aminophenyl)-1-methylethyl]benzene, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]:[(2a)+(2b)]=75:25 wherein (1a):(1b)=0:100 and (2a):(2b)=0:100 was obtained in an amount of 67.0 g (yield: 96%) by the same manner as in Synthetic Example 1.

The IR spectrum measurement of the resultant polyimide showed typical absorption bands of imide at 1718 cm⁻¹ and 1783 cm⁻¹. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 27

Using 27.63 g (75 mmol) of bis(4-aminophenoxy)biphenyl, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]:[(2a)+(2b)]=75:25 wherein (1a):(1b)=0:100 and (2a):(2b)=0:100 was obtained in an amount of 69.5 g (yield: 98%) by the same manner as in Synthetic Example 1.

The IR spectrum measurement of the resultant polyimide showed typical absorption bands of imide at 1718 cm$^{-1}$ and 1780 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 28

Using 28.82 g (75 mmol) of bis(4-aminophenoxy) diphenyl ether, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]:1(2a)+(2b)]=75:25 wherein (1a):(1b)=0:100 and (2a):(2b)=0:100 was obtained in an amount of 70.0 g (yield: 97%) by the same manner as in Synthetic Example 1.

The IR spectrum measurement of the resultant polyimide showed typical absorption bands of imide at 1718 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 29

Using 32.08 g (75 mmol) of bis[4-(4-aminophenoxy) phenyl]sulfone, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]:[(2a)+(2b)]=75:25 wherein (1a):(1b)=0:100 and (2a):(2b)=0:100 was obtained in an amount of 74.0 g (yield: 97%) by the same manner as in Synthetic Example 1.

The IR spectrum measurement of the resultant polyimide showed typical absorption bands of imide at 1719 cm$^{-1}$ and 1785 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 30

Using 30.78 g (75 mmol) of 2,2-bis[4-(4-aminophenoxy) phenyl]propane, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]: [(2a)+(2b)]=75:25 wherein (1a):(1b)=0:100 and (2a):(2b)=0:100 was obtained in an amount of 73.0 g (yield: 98%) by the same manner as in Synthetic Example 1.

The IR spectrum measurement of the resultant polyimide showed typical absorption bands of imide at 1720 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 31

Using 38.89 g (75 mmol) of 2,2-bis[4-(4-aminophenoxy) phenyl]hexafluoropropane, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]:[(2a)+(2b)]=75:25 wherein (1a):(1b)=0:100 and (2a):(2b)=0:100 was obtained in an amount of 80.0 g (yield: 97%) by the same manner as in Synthetic Example 1.

The IR spectrum measurement of the resultant polyimide showed typical absorption bands of imide at 1715 cm$^{-1}$ and 1786 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 32

Using 26.14 g (75 mmol) of 9,9-bis(4-aminophenyl) fluorene, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]:[(2a)+(2b)]=75:25 wherein (1a):(1b)=0:100 and (2a):(2b)=0:100 was obtained in an amount of 66.0 g (yield: 95%) by the same manner as in Synthetic Example 1.

The IR spectrum measurement of the resultant polyimide showed typical absorption bands of imide at 1720 cm$^{-1}$ and 1780 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 33

Using 20.53 g (50 mmol) of 2,2-bis[4-(4-aminophenoxy) phenyl]propane, 12.43 g (50 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=50:50 wherein (1a):(1b)=100:0 and (2a):(2b)=100:0 was obtained in an amount of 61.0 g (yield: 93%) by the same manner as in Synthetic Example 1.

The IR spectrum measurement of the resultant polyimide showed typical absorption bands of imide at 1715 cm$^{-1}$ and 1786 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 34

Using 30.79 g (75 mmol) of 2,2-bis[4-(4-aminophenoxy) phenyl]propane, 6.21 g (25 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=75:25 wherein (1a):(1b)=100:0 and (2a):(2b)=100:0 was obtained in an amount of 65.0 g (yield: 94%) by the same manner as in Synthetic Example 1.

The IR spectrum measurement of the resultant polyimide showed typical absorption bands of imide at 1720 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 35

Using 32.84 g (80 mmol) of 2,2-bis[4-(4-aminophenoxy) phenyl]propane, 4.97 g (20 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=80:20 wherein (1a):(1b)=100:0 and (2a):(2b)=100:0 was obtained in an amount of 68.0 g (yield: 97%) by the same manner as in Synthetic Example 1.

The IR spectrum measurement of the resultant polyimide showed typical absorption bands of imide at 1720 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 36

Using 36.95 g (90 mmol) of 2,2-bis[4-(4-aminophenoxy) phenyl]propane, 2.49 g (10 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=90:10 wherein (1a):(1b)=100:0 and (2a):(2b)=100:0 was obtained in an amount of 69.0 g (yield: 97%) by the same manner as in Synthetic Example 1.

The IR spectrum measurement of the resultant polyimide showed typical absorption bands of imide at 1720 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 37

Using 30.79 g (75 mmol) of 2,2-bis[4-(4-aminophenoxy) phenyl]propane, 6.21 g (25 mmol) of 1,3-bis(3-aminopropyl)-1,1,3,3-tetramethyldisiloxane, 17.91 g (50 mmol) of 3,3',4,4'-diphenylsulfonetetracarboxylic dianhydride, 20.53 g (50 mmol) of ethylene glycol bistrimellitate dianhydride and 300 ml of N-methyl-2-pyrrolidone, a polyimide composed of the repeating units in a proportion of [(1a)+(1b)]:[(2a)+(2b)]=75:25 wherein (1a):(1b)=50:50 and (2a):(2b)=50:50 was obtained in an amount of 68.5 g (yield: 95%) by the same manner as in Synthetic Example 1.

The IR spectrum measurement of the resultant polyimide showed typical absorption bands of imide at 1715 cm$^{-1}$ and 1786 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 38

Using 30.79 g (75 mmol) of 2,2-bis[4-(4-aminophenoxy) phenyl]propane, 6.21 g (25 mmol) of 1,3-bis(3-aminopropyl)-1,1,3,3-tetramethyldisiloxane, 8.96 g (25 mmol) of 3,3',4,4'-diphenylsulfonetetracarboxylic dianhydride, 30.77 g (75 mmol) of ethylene glycol bistrimellitate dianhydride and 300 ml of N-methyl-2-pyrrolidone, a polyimide composed of the repeating units in a proportion of [(1a)+(1b)]:[(2a)+(2b)]=75:25 wherein (1a):(1b)=25:75 and (2a):(2b)=25:75 was obtained in an amount of 69.5 g (yield: 95%) by the same manner as in Synthetic Example 1.

The IR spectrum measurement of the resultant polyimide showed typical absorption bands of imide at 1715 cm$^{-1}$ and 1786 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 39

Using 30.79 g (75 mmol) of 2,2-bis[4-(4-aminophenoxy) phenyl]propane, 6.21 g (25 mmol) of 1,3-bis(3-aminopropyl)-1,1,3,3-tetramethyldisiloxane, 26.87 g (75 mmol) of 3,3',4,4'-diphenylsulfonetetracarboxylic dianhydride, 10.26 g (25 mmol) of ethylene glycol bistrimellitate dianhydride and 300 ml of N-methyl-2-pyrrolidone, a polyimide composed of the repeating units in a proportion of [(1a)+(1b)]:[(2a)+(2b)]=75:25 wherein (1a):(1b)=75:25 and (2a):(2b)=75:25 was obtained in an amount of 66.0 g (yield: 94%) by the same manner as in Synthetic Example 1.

The IR spectrum measurement of the resultant polyimide showed typical absorption bands of imide at 1715 cm$^{-1}$ and 1786 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 40

Using 30.79 g (75 mmol) of 2,2-bis[4-(4 -aminophenoxy) phenyl]propane, 9.42 g (25 mmol) of 1,3-bis [(aminophenoxy)methyl]-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]= 75:25 wherein (1a):(1b)=100:0 and (2a):(2b)=100:0 was obtained in an amount of 69.0 g (yield: 95%) by the same manner as in Synthetic Example 1.

The IR spectrum measurement of the resultant polyimide showed typical absorption bands of imide at 1720 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 41

Using 30.79 g (75 mmol) of 2,2-bis[4-(4-aminophenoxy) phenyl]propane, 10.72 g (25 mmol) of aminopropyl terminated dimethylsiloxane tetramer represented by the following formula (5) wherein Y=NH$_2$, R=propylene, n=3:

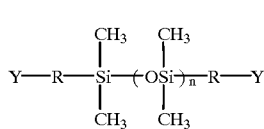

(5)

35.83 g (100 mmol) of 3,3',4,4'-diphenylsulfone-tetracarboxylic dianhydride, and 300 ml of N-methyl-2-pyrrolidone, a polyimide composed of the repeating units in a proportion of [(1a)+(1b)]:[(2a)+(2b)]=75:25 wherein (1a):(1b)=100:0 and (2a):(2b)=100:0 was obtained in an amount of 67.0 g (yield: 91%) by the same manner as in Synthetic Example 1.

The IR spectrum measurement of the resultant polyimide showed typical absorption bands of imide at 1712 cm$^{-1}$ and 1783 cm$^{-1}$. The molecular weight, glass transition temperature and temperature of initiating thermal decomposition of the polyimide were determined. The results are shown in Table 1. The resultant polyimide was dissolved in tetrahydrofuran so as to be the concentration of 25% by weight to produce a coating varnish.

Synthetic Example 42

Using 31.04 g (100 mmol) of 4,4'-diamino-3,3',5,5'-tetraethyldiphenylmethane, 35.83 g (100 mmol) of 3,3',4,4'-diphenylsulfone tetracarboxylic dianhydride and 300 ml of N-methyl-2-pyrrolidone, a polyimide composed of the repeating units in a proportion of [(1a)+(1b)]:[(2a)+(2b)]:100:0 wherein (1a):(1b)=100:0 and (2a):(2b)=0:0 was obtained in an amount of 58.8 g (yield: 93%) by the same manner as in Synthetic Example 1.

The IR spectrum measurement of the resultant polyimide showed typical adsorption bands of imide at 1720 cm$^{-1}$ and 1780 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 43

Using 15.52 g (50 mmol) of 4,4'-diamino-3,3',5,5'-tetraethyldiphenylmethane, 13.34 g (37.5 mmol) of 3,3',4,4'-diphenylsulfone tetracarboxylic dianhydride, 5.13 g (12.5 mmol) of ethylene glycol bistrimellitate dianhydride and 150 ml of N-methyl-2-pyrrolidone, a polyimide composed of the repeating units in a proportion of [(1a)+(1b)]:[(2a)+(2b)]=100:0 wherein (1a):(1b)=75:25 and (2a):(2b)=0:0 was obtained in an amount of 29.6 g (yield: 92%) by the same manner as in Synthetic Example 1.

The IR spectrum measurement of the resultant polyimide showed typical adsorption bands of imide at 1720 cm$^{-1}$ and 1780 cm$^{31\ 1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 44

Using 15.52 g (50 mmol) of 4,4'-diamino-3,3',5,5'-tetraethyldiphenylmethane, 8.89 g (25 mmol) of 3,3',4,4'-diphenylsulfone tetracarboxylic dianhydride, 10.26 g (25 mmol) of ethylene glycol bistrimellitate dianhydride and 150 ml of N-methyl-2-pyrrolidone, a polyimide composed of the repeating units in a proportion of [(1a)+(1b)]:[(2a)+(2b)]=100:0 wherein (1a):(1b)=50:50 and (2a):(2b)=0:0 was obtained in an amount of 29.6 g (yield: 92%) by the same manner as in Synthetic Example 1.

The IR spectrum measurement of the resultant polyimide showed typical adsorption bands of imide at 1720 cm$^{-1}$ and 1780 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 45

Using 7.76 g (25 mmol) of 4,4'-diamino-3,3',5,5'-tetraethyldiphenylmethane, 6.21 g (25 mmol) of bis(3-aminopropyl)tetramethyldisiloxane, 17.91 g (50 mmol), 3,3',4,4'-diphenylsulfone tetracarboxylic dianhydride and 150 ml of N-methyl-2-pyrrolidone, a polyimide composed of the repeating units in a proportion of [(1a)+(1b)]:[(2a)+(2b)]=50:50 wherein (1a):(1b)=100:0 and (2a):(2b)=100:0 was obtained in an amount of 27.4 g (yield: 91%) by the same manner as in Synthetic Example 1.

The IR spectrum measurement of the resultant polyimide showed typical adsorption bands of imide at 1720 cm$^{-1}$ and 1780 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 46

Using 11.64 g (37.5 mmol) of 4,4'-diamino-3,3',5,5'-tetraethyldiphenylmethane, 3.11 g (12.5 mmol) of bis(3-aminopropyl)tetramethyldisiloxane, 17.91 g (50 mmol), 3,3',4,4'-diphenylsulfone tetracarboxylic dianhydride and 150 ml of N-methyl-2-pyrrolidone, a polyimide composed of the repeating units in a proportion of [(1a)+(1b)]:[(2a)+(2b)]=75:25 wherein (1a):(1b)=100:0 and (2a):(2b)=100:0 was obtained in an amount of 29.6 g (yield: 92%) by the same manner as in Synthetic Example 1.

The IR spectrum measurement of the resultant polyimide showed typical adsorption bands of imide at 1720 cm$^{-1}$ and 1780 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 47

Using 12.72 g (50 mmol) of 4,4'-diamino-3,3',5,5'-tetraethyldiphenylmethane, 20.51 g (50 mmol) of ethylene glycol bistrimellitate dianhydride and 150 ml of N-methyl-2-pyrrolidone, a polyimide composed of the repeating units in a proportion of [(1a)+(1b)]:[(2a)+(2b)]=100:0 wherein (1a):(1b)=0:100 and (2a):(2b)=0:0 was obtained in an amount of 29.5 g (yield: 94%) by the same manner as in Synthetic Example 1.

The IR spectrum measurement of the resultant polyimide showed typical adsorption bands of imide at 1720 cm$^{-1}$ and 1780 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 48

Using 15.52 g (50 mmol) of 4,4'-diamino-3,3',5,5'-tetraethyldiphenylmethane, 20.51 g (50 mmol) of ethylene glycol bistrimellitate dianhydride and 150 ml of N-methyl-2-pyrrolidone, a polyimide composed of the repeating units in a proportion of [(1a)+(1b)]:[(2a)+(2b)]=100:0 wherein (1a):(1b)=0:100 and (2a):(2b)=0:0 was obtained in an amount of 31.8 g (yield: 93%) by the same manner as in Synthetic Example 1.

The IR spectrum measurement of the resultant polyimide showed typical adsorption bands of imide at 1720 $cm^{-1}$ and 1780 $cm^{-1}$. The molecular weight, glass transition temperature, and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 49

Using 20.53 g (50 mmol) of 2,2-bis[4-(4-aminophenoxy)phenyl]propane, 17.91 g (50 mmol) of 3,3',4,4'-diphenylsulfone tetracarboxylic dianhydride and 150 ml of N-methyl-2-pyrrolidone, a polyimide composed of the repeating units in a proportion of [(1a)+(1b)]:[(2a)+(2b)]=100:0 wherein (1a):(1b)=100:0 and (2a):(2b)=0:0 was obtained in an amount of 35.9 g (yield: 98%) by the same manner as in Synthetic Example 1.

The IR spectrum measurement of the resultant polyimide showed typical adsorption bands of imide at 1720 $cm^{-1}$ and 1780 $cm^{-1}$. The molecular weight, glass transition temperature, and temperature of initiating thermal decomposition of the polyimide were determined. The results are shown in Table 1. The resultant polyimide was dissolved in tetrahydrofuran so as to be the concentration of 25% by weight to produce a coating varnish.

Synthetic Example 50

Using 12.72 g (50 mmol) of 4,4'-diamino-3,3',5,5'-tetramethyldiphenylmethane, 17.91 g (50 mmol) of 3,3',4,4'-diphenylsulfone tetracarboxylic dianhydride and 150 ml of N-methyl-2-pyrrolidone, a polyimide composed of the repeating units in a proportion of [(1a)+(1b)]:[(2a)+(2b)]=100:0 wherein (1a):(1b)=100:0 and (2a):(2b)=0:0 was obtained in an amount of 28.0 g (yield: 97%) by the same manner as in Synthetic Example 1.

The IR spectrum measurement of the resultant polyimide showed typical adsorption bands of imide at 1720 $cm^{-1}$ and 1780 $cm^{-1}$. The molecular weight, glass transition temperature, and temperature of initiating thermal decomposition of the polyimide were determined. The results are shown in Table 1. The resultant polyimide was dissolved in tetrahydrofuran so as to be the concentration of 25% by weight to produce a coating varnish.

Synthetic Example 51

Using 18.42 g (50 mmol) of 4,4'-bis(4-aminophenoxy)biphenyl, 17.91 g (50 mmol) of 3,3',4,4'0 -diphenylsulfone tetracarboxylic dianhydride and 150 ml of N-methyl-2-pyrrolidone, a polyimide composed of the repeating units in a proportion of [(1a)+(1b)]:[(2a)+(2b)]=100:0 wherein (1a):(1b)=100:0 and (2a):(2b)=0:0 was obtained in an amount of 33.1 g (yield: 96%) by the same manner as in Synthetic Example 1.

The IR spectrum measurement of the resultant polyimide showed typical adsorption bands of imide at 1720 $cm^{-1}$ and 1780 $cm^{-1}$. The molecular weight, glass transition temperature, and temperature of initiating thermal decomposition of the polyimide were determined. The results are shown in Table 1. The resultant polyimide was dissolved in tetrahydrofuran so as to be the concentration of 25% by weight to produce a coating varnish.

Synthetic Example 52

Using 21.63 g (50 mmol) of bis[4-(4-aminophenoxy)phenyl]sulfone, 17.91 g (50 mmol) of 3,3',4,4'-diphenylsulfone tetracarboxylic dianhydride and 150 ml of N-methyl-2-pyrrolidone, a polyimide composed of the repeating units in a proportion of [(1a)+(1b)]:[(2a)+(2b)]=100:0 wherein (1a):(1b)=100:0 and (2a):(2b)=0:0 was obtained in an amount of 35.8 g (yield: 95%) by the same manner as in Synthetic Example 1.

The IR spectrum measurement of the resultant polyimide showed typical adsorption bands of imide at 1720 $cm^{-1}$ and 1780 $cm^{-1}$. The molecular weight, glass transition temperature, and temperature of initiating thermal decomposition of the polyimide were determined. The results are shown in Table 1. The resultant polyimide was dissolved in tetrahydrofuran so as to be the concentration of 25% by weight to produce a coating varnish.

Synthetic Example 53

Using 10.01 g (50 mmol) of 4,4'-diaminodiphenyl ether, 17.91 g (50 mmol) of 3,3',4,4'-diphenylsulfone tetracarboxylic dianhydride and 150 ml of N-methyl-2-pyrrolidone, a polyimide composed of the repeating units in a proportion of [(1a)+(1b)]:[(2a)+(2b)]=100:0 wherein (1a):(1b)=100:0 and (2a):(2b)=0:0 was obtained in an amount of 24.3 g (yield: 93%) by the same manner as in Synthetic Example 1.

The IR spectrum measurement of the resultant polyimide showed typical adsorption bands of imide at 1720 $cm^{-1}$ and 1780 $cm^{-1}$. The molecular weight, glass transition temperature, and temperature of initiating thermal decomposition of the polyimide were determined. The results are shown in Table 1. The resultant polyimide was dissolved in tetrahydrofuran so as to be the concentration of 25% by weight to produce a coating varnish.

Synthetic Example 54

Using 9.92 g (50 mmol) of 4,4'-diaminodiphenylmethane, 17.91 g (50 mmol) of 3,3',4,4'-diphenylsulfone tetracarboxylic dianhydride and 150 ml of N-methyl-2-pyrrolidone, a polyimide composed of the repeating units in a proportion of [(1a)+(1b)]:[(2a)+(2b)]=100:0 wherein (1a):(1b)=100:0 and (2a):(2b)=0:0 was obtained in an amount of 25.2 g (yield: 97%) by the same manner as in Synthetic Example 1.

The IR spectrum measurement of the resultant polyimide showed typical adsorption bands of imide at 1720 $cm^{-1}$ and 1780 $cm^{-1}$. The molecular weight, glass transition temperature, and temperature of initiating thermal decomposition of the polyimide were determined. The results are shown in Table 1. The resultant polyimide was dissolved in tetrahydrofuran so as to be the concentration of 25% by weight to produce a coating varnish.

Synthetic Example 55

Using 10.81 g (50 mmol) of 4,4'-diaminodiphenyl sulfide, 17.91 g (50 mmol) of 3,3',4,4'-diphenylsulfone tetracarboxylic dianhydride and 150 ml of N-methyl-2-pyrrolidone, a polyimide composed of the repeating units in a proportion of [(1a)+(1b)]:[(2a)+(2b)]=100:0 wherein (1a):(1b)=100:0 and (2a):(2b)=0:0 was obtained in an amount of 24.8 g (yield: 92%) by the same manner as in Synthetic Example 1.

The IR spectrum measurement of the resultant polyimide showed typical adsorption bands of imide at 1720 $cm^{-1}$ and 1780 $cm^{-1}$. The molecular weight, glass transition temperature, and temperature of initiating thermal decomposition of the polyimide were determined. The results are shown in Table 1. The resultant polyimide was dissolved in tetrahydrofuran so as to be the concentration of 25% by weight to produce a coating varnish.

TABLE 1

| Synthetic Example No. | Number average molecular weight | Glass transition temperature (°C.) | Temperature of initiating thermal decomposition (°C.) |
|---|---|---|---|
| 1 | 39,000 | 230 | 452 |
| 2 | 14,000 | 217 | 456 |
| 3 | 37,000 | 180 | 450 |
| 4 | 13,000 | 220 | 451 |
| 5 | 48,000 | 190 | 450 |
| 6 | 68,000 | 190 | 450 |
| 7 | 40,000 | 190 | 455 |
| 8 | 39,000 | 230 | 450 |
| 9 | 25,000 | 192 | 450 |
| 10 | 38,000 | 160 | 450 |
| 11 | 53,000 | 232 | 450 |
| 12 | 25,000 | 230 | 453 |
| 13 | 12,000 | 170 | 450 |
| 14 | 26,000 | 211 | 458 |
| 15 | 23,000 | 201 | 451 |
| 16 | 36,000 | 241 | 452 |
| 17 | 29,000 | 190 | 452 |
| 18 | 12,000 | 177 | 456 |
| 19 | 27,000 | 140 | 455 |
| 20 | 13,000 | 180 | 451 |
| 21 | 38,000 | 150 | 453 |
| 22 | 58,000 | 153 | 453 |
| 23 | 38,000 | 149 | 455 |
| 24 | 29,000 | 190 | 453 |
| 25 | 15,000 | 152 | 454 |
| 26 | 28,000 | 130 | 453 |
| 27 | 43,000 | 182 | 452 |
| 28 | 22,000 | 190 | 453 |
| 29 | 11,000 | 134 | 451 |
| 30 | 22,000 | 171 | 448 |
| 31 | 21,000 | 161 | 454 |
| 32 | 26,000 | 201 | 455 |
| 33 | 23,000 | 180 | 451 |
| 34 | 45,000 | 226 | 465 |
| 35 | 46,000 | 236 | 464 |
| 36 | 48,000 | 248 | 460 |
| 37 | 34,000 | 199 | 458 |
| 38 | 31,000 | 183 | 455 |
| 39 | 43,000 | 220 | 465 |
| 40 | 44,000 | 230 | 455 |
| 41 | 43,000 | 180 | 440 |
| 42 | 49,000 | 282 | 446 |
| 43 | 81,000 | 252 | 420 |
| 44 | 89,000 | 226 | 410 |
| 45 | 26,000 | 186 | 458 |
| 46 | 69,000 | 224 | 421 |
| 47 | 37,000 | 232 | 400 |
| 48 | 31,000 | 200 | 421 |
| 49 | 82,000 | 263 | 465 |
| 50 | 83,000 | 339 | 465 |
| 51 | 76,000 | 292 | 445 |
| 52 | 78,000 | 281 | 465 |
| 53 | 54,000 | 293 | 465 |
| 54 | 43,000 | 314 | 425 |
| 55 | 40,000 | 301 | 465 |

In the above Table 1, the measurement of the molecular weight of polyimides was carried out using tetrahydrofuran as an eluent and Shodex 80M×2 as a column. Value of the molecular weight is a number average molecular weight which is calculated as polystyrene. The glass transition temperature was determined by a differential thermal analysis (in a nitrogen atmosphere, heated at 10° C./min.) and the temperature of initiating thermal decomposition was determined by a thermogravimetry (in a nitrogen atmosphere, heated at 10° C./min.)

Comparative Synthetic Example 1

Using 16.4 g (0.04 mol) of 2,2-bis[4-(4-aminophenoxy)phenyl]propane and 8.42 g (0.04 mol) of trimellitic dianhydride monochloride, a polyetheramideimide resin was obtained in an amount of 20.8 g (yield: 92%) by the same manner as in Synthetic Example 1.

The IR spectrum measurement of the resultant polyetheramideimide resin showed typical absorption bands of imide at 1715 cm$^{-1}$ and 1786 cm$^{-1}$ and a typical absorption band of amide at 1640 cm$^{-1}$. The molecular weight of the resin was 21,000, which had the glass transition temperature of 228° C. and temperature of initiating thermal decomposition of 430° C. This polyetheramideimide resin was dissolved in tetrahydrofuran so as to be the concentration of 25% by weight to produce a coating varnish.

Comparative Synthetic Example 2

Using 8.01 g (0.04 mol) of 4,4'-diaminodiphenyl ether and 10.8 g (0.04 mol) of biphenyltetracarboxylic dianhydride, a polyimide was obtained in an amount of 16.1 g (yield: 93%) by the same manner as in Synthetic Example 1.

The IR spectrum measurement of the resultant polyetheramideimide resin showed typical absorption bands of imide at 1715 cm$^{-1}$ and 1786 cm$^{-1}$. The molecular weight of the resultant polyimide could not be measured because it was insoluble in solvents such as tetrahydrofurane, etc. The polyimide had a glass transition temperature of 290° C. and temperature of initiating thermal decomposition of 560° C. This polyimide resin was dissolved in o-dichlorophenol so as to be the concentration of 20% by weight to produce a coating varnish.

Comparative Synthetic Example 3

20.8 g (0.04 mol) of 2,2-bis(1,1',2,2'-tetracarboxy-4-phenoxyphenyl)propane dianhydride was dissolved in 100 g of N-methyl-2-pyrrolidone. To the resultant solution was added 4.34 g (0.04 mol) of m-phenylenediamine, followed by stirring at 0° C. for 4 hours to obtain a varnish of polyamic acid in N-methyl-2-pyrrolidone which had the concentration of 20% by weight. The resultant varnish was used as a coating varnish. A resin obtained by polyetherimidation of the above-mentioned polyamic acid had a glass transition temperature of 216° C. and temperature of initiating thermal decomposition of 510° C. The IR spectrum measurement of the resultant resin film showed typical absorption bands of imide at 1715 cm$^{-1}$ and 1786 cm$^{-1}$. The molecular weight of the resin could not be measured because resultant polyimide could not be measured because it was insoluble in solvents such as tetrahydrofuran, etc.

Comparative Synthetic Example 4

Using polyamideimide (Torlon 4000T, AMOCO CORP., Ltd.), a varnish in N-methyl-2-pyrrolidone having a concentration of 20% by weight was produced.

Example 1

The coating varnish containing the polyimide (Tg: 282° C.) obtained in Synthetic Example 42 was applied to a side of a substrate which is 50 μm thick polyimide film by a bar-coater so as to have a dried thickness of 25 μm, and dried in a hot air circulating oven at 150° C. for 5 minutes to form a higher Tg adhesive layer. The coating varnish containing the polyimide obtained in Synthetic Example 2 (Tg: 217° C.) was then applied to the other side the substrate so as to have a dried thickness of 25 μm, and dried in a hot air circulating oven at 150° C. for 5 minutes to form a lower Tg adhesive layer. Thus an adhesive tape having a total thickness of 100 μm was produced, in which two adhesive layers having each a different Tg were formed on the both side of the substrate.

Examples 2–40

Using polyimides obtained in Synthetic Examples 1–48, adhesive tapes were produced by the same manner as in Example 1. Alumina filler having a particle size of 0.05 μm was added in an amount of 10% by weight to the higher Tg adhesive layer of Example 37 and to the lower Tg adhesive layer of Example 38. Silica filler having a particle size of 0.07 μm was added in an amount of 10% by weight to the higher Tg adhesive layer of Example 39.

Coating varnishes used for formation of the adhesive layers, fillers and amounts thereof, and adhesion temperatures of the formed adhesive layers in Examples 1–40 are shown in Table 2.

The adhesion temperature of the higher Tg adhesive layer side and that of the lower Tg adhesive layer side in Table 2 correspond each to the glass transition temperature of corresponding Synthetic Example in Table 1.

Comparative Example 1

Using the coating varnish containing the polyimide (Tg: 160° C.) obtained in Synthetic Example 10, polyimide adhesive layers having each the same Tg were formed on both sides of the substrate by the same manner as in Example 1 to produce a comparative adhesive tape.

Comparative Example 2

A 20% by weight solution of polyimide varnish (Lark TPI, produced by MITSUI TOATSU CHEMICALS INC.) in N-methyl-2-pyrrolidone was prepared. This solution was applied to a side of a 50 μm thick polyimide film so as to be a dried thickness of 25 μm, and dried in a hot air circulating oven at 150° C. for 1 hour to an adhesive layer. Thereafter, the same solution was applied to the other side of the polyimide film so as to be a dried thickness of 25 μm, followed by drying in a hot air circulating oven at 150° C. for 1 hour and then at 250° C. for 1 hour to obtain a comparative adhesive tape.

Coating varnishes used for formation of the adhesive layers, fillers and amounts thereof, and adhesion temperatures of the formed adhesive layers in Comparative Examples 1 and 2 are shown in Table 3.

TABLE 2

| Adhesive tape | Higher Tg adhesive layer Coating varnish | Filler (wt. %) | Adhesion temperature of higher Tg layer (° C.) | Lower Tg adhesive layer Coating varnish | Filler (wt. %) | Adhesion temperature of lower Tg layer (° C.) |
| --- | --- | --- | --- | --- | --- | --- |
| Ex. 1 | Syn. Ex. 42 | 0 | 370 | Syn. Ex. 2 | 0 | 300 |
| Ex. 2 | Syn. Ex. 1 | 0 | 310 | Syn. Ex. 3 | 0 | 260 |
| Ex. 3 | Syn. Ex. 11 | 0 | 320 | Syn. Ex. 5 | 0 | 270 |
| Ex. 4 | Syn. Ex. 8 | 0 | 310 | Syn. Ex. 6 | 0 | 270 |
| Ex. 5 | Syn. Ex. 11 | 0 | 320 | Syn. Ex. 7 | 0 | 270 |
| Ex. 6 | Syn. Ex. 43 | 0 | 340 | Syn. Ex. 9 | 0 | 280 |
| Ex. 7 | Syn. Ex. 4 | 0 | 300 | Syn. Ex. 10 | 0 | 240 |
| Ex. 8 | Syn. Ex. 12 | 0 | 310 | Syn. Ex. 13 | 0 | 250 |
| Ex. 9 | Syn. Ex. 16 | 0 | 350 | Syn. Ex. 14 | 0 | 300 |
| Ex. 10 | Syn. Ex. 43 | 0 | 340 | Syn. Ex. 15 | 0 | 290 |
| Ex. 11 | Syn. Ex. 43 | 0 | 340 | Syn. Ex. 17 | 0 | 270 |
| Ex. 12 | Syn. Ex. 34 | 0 | 320 | Syn. Ex. 18 | 0 | 260 |
| Ex. 13 | Syn. Ex. 35 | 0 | 320 | Syn. Ex. 19 | 0 | 220 |
| Ex. 14 | Syn. Ex. 36 | 0 | 330 | Syn. Ex. 20 | 0 | 260 |
| Ex. 15 | Syn. Ex. 39 | 0 | 300 | Syn. Ex. 21 | 0 | 230 |
| Ex. 16 | Syn. Ex. 40 | 0 | 310 | Syn. Ex. 22 | 0 | 240 |
| Ex. 17 | Syn. Ex. 42 | 0 | 370 | Syn. Ex. 23 | 0 | 230 |
| Ex. 18 | Syn. Ex. 43 | 0 | 340 | Syn. Ex. 24 | 0 | 270 |
| Ex. 19 | Syn. Ex. 44 | 0 | 310 | Syn. Ex. 25 | 0 | 240 |
| Ex. 20 | Syn. Ex. 46 | 0 | 330 | Syn. Ex. 26 | 0 | 210 |
| Ex. 21 | Syn. Ex. 47 | 0 | 320 | Syn. Ex. 27 | 0 | 250 |
| Ex. 22 | Syn. Ex. 34 | 0 | 320 | Syn. Ex. 28 | 0 | 260 |
| Ex. 23 | Syn. Ex. 34 | 0 | 320 | Syn. Ex. 29 | 0 | 250 |
| Ex. 24 | Syn. Ex. 43 | 0 | 340 | Syn. Ex. 30 | 0 | 290 |
| Ex. 25 | Syn. Ex. 46 | 0 | 330 | Syn. Ex. 31 | 0 | 260 |
| Ex. 26 | Syn. Ex. 43 | 0 | 340 | Syn. Ex. 32 | 0 | 290 |
| Ex. 27 | Syn. Ex. 46 | 0 | 330 | Syn. Ex. 33 | 0 | 260 |
| Ex. 28 | Syn. Ex. 43 | 0 | 340 | Syn. Ex. 37 | 0 | 280 |
| Ex. 29 | Syn. Ex. 46 | 0 | 330 | Syn. Ex. 38 | 0 | 270 |
| Ex. 30 | Syn. Ex. 46 | 0 | 330 | Syn. Ex. 41 | 0 | 260 |
| Ex. 31 | Syn. Ex. 46 | 0 | 330 | Syn. Ex. 45 | 0 | 290 |
| Ex. 32 | Syn. Ex. 43 | 0 | 340 | Syn. Ex. 48 | 0 | 280 |
| Ex. 33 | Syn. Ex. 35 | 0 | 320 | Syn. Ex. 1/Syn. Ex. 10 = 60/40 | 0 | 280 |
| Ex. 34 | Syn. Ex. 35 | 0 | 320 | Syn. Ex. 16/ Syn. Ex. 10 = 50/50 | a | 280 |
| Ex. 35 | Syn. Ex. 35 | 0 | 320 | Syn. Ex. 33/ Syn. Ex. 36 = 50/50 | 0 | 280 |
| Ex. 36 | Syn. Ex. 35 | 0 | 320 | Syn. Ex. 8/ Syn. Ex. 26 = 20/80 | D | 230 |
| Ex. 37 | Syn. Ex. 35 | 0 | 320 | Syn. Ex. 10 | Alumina 10 | 270 |
| Ex. 38 | Syn. Ex. 14 | Alumina 10 | 330 | Syn. Ex. 45 | 0 | 290 |

TABLE 2-continued

| Adhesive tape | Higher Tg adhesive layer Coating varnish | Filler (wt. %) | Adhesion temperature of higher Tg layer (° C.) | Lower Tg adhesive layer Coating varnish | Filler (wt. %) | Adhesion temperature of lower Tg layer (° C.) |
|---|---|---|---|---|---|---|
| Ex. 39 | Syn. Ex. 35 | 0 | 320 | Syn. Ex. 10 | Silica 10 | 270 |
| Ex. 40 | Syn. Ex. 14 | Silica 10 | 330 | Syn. Ex. 45 | 0 | 290 |

Note)
"Silica": Silica filler; produced by Arakawa Chemical Industries Co. Ltd.; particle size: 0.07 μm.
"Alumina": Alumina filler; produced by Showa Denko K.K.; particle size: 0.05 μm.

TABLE 3

| Adhesive tape | The first adhesive layer Coating varnish | Filler (wt %) | Adhesion temperature (° C.) | The second adhesive layer Coating varnish | Filler (wt %) | Adhesion temperature (° C.) |
|---|---|---|---|---|---|---|
| Com. Ex. 1 | Syn. Ex. 10 | 0 | 240 | Syn. Ex. 10 | 0 | 240 |
| Com. Ex. 2 | Lark TPI | 0 | 380 | LARK TPI | 0 | 380 |

Example 41

The coating varnish containing the polyimide (Tg: 180° C.) obtained in Synthetic Example 3 was applied to a surface of a releasing film composed of polyethylene terephthalate having the thickness of 38 μm (300×500 cm) by a bar-coater so as to have a dried thickness of 20 μm, and dried in a hot air circulating oven at 150° C. for 5 minutes to form an adhesive layer A1. Then, the coating varnish containing the polyimide obtained in Synthetic Example 42 (Tg: 282° C.) was applied to the formed adhesive layer A1 so as to have a dried thickness of 20 μm, and dried in a hot air circulating oven at 150° C. for 10 minutes to form the substrate B. Thereafter, the coating varnish containing the polyimide (Tg: 160° C.) obtained in Synthetic Example 10 was applied to the formed substrate B so as to have a dried thickness of 20 μm, and dried in a hot air circulating oven at 150° C. for 15 minutes to form an adhesive layer A2, by which an adhesive tape having the total thickness of 60 μm, in which three layer were laminated, was produced.

Examples 42–88

In Examples 42–88, adhesive tapes in which the adhesive layer A1, the substrate B and the adhesive layer A2 were laminated were produced by the same manner as in Example 1, except that each coating varnish containing the polyimide in the above described Synthetic Examples was used alone or as a mixture of two or more thereof, or a coating varnish containing the filler was used, as shown in Table 4.

Coating varnishes used for formation of the adhesive layers, fillers and amounts thereof, and adhesion temperatures of the formed adhesive layers in Examples 41–88 are shown in Table 3.

The adhesion temperature of the adhesive layer A1 and that of the adhesive layer A2 in Table 4 correspond each to the glass transition temperature of corresponding Synthetic Example in Table 1.

TABLE 4

| Adhesive tape | Adhesive layer A1 | | | Adhesive layer A2 | | | Substrate B |
|---|---|---|---|---|---|---|---|
| | Coating varnish | Filler (wt %) | Adhesion temperature (° C.) | Coating varnish | Filler (wt %) | Adhesion temperature (° C.) | Coating varnish |
| Example 41 | Syn. Ex. 3 | 0 | 260 | Syn. Ex. 10 | 0 | 240 | Syn. Ex. 42 |
| Example 42 | Syn. Ex. 10 | 0 | 240 | Syn. Ex. 10 | 0 | 240 | Syn. Ex. 49 |
| Example 43 | Syn. Ex. 13 | 0 | 250 | Syn. Ex. 13 | 0 | 250 | Syn. Ex. 50 |
| Example 44 | Syn. Ex. 26 | 0 | 210 | Syn. Ex. 26 | 0 | 210 | Syn. Ex. 51 |
| Example 45 | Syn. Ex. 29 | 0 | 250 | Syn. Ex. 29 | 0 | 250 | Syn. Ex. 52 |
| Example 46 | Syn. Ex. 33 | 0 | 260 | Syn. Ex. 33 | 0 | 260 | Syn. Ex. 53 |
| Example 47 | Syn. Ex. 34 | 0 | 320 | Syn. Ex. 34 | 0 | 320 | Syn. Ex. 54 |
| Example 48 | Syn. Ex. 37 | 0 | 280 | Syn. Ex. 37 | 0 | 280 | Syn. Ex. 55 |
| Example 49 | Syn. Ex. 45 | 0 | 290 | Syn. Ex. 45 | 0 | 290 | Syn. Ex. 42 |
| Example 50 | Syn. Ex. 45 | 0 | 290 | Syn. Ex. 45 | 0 | 290 | Syn. Ex. 43 |
| Example 51 | Syn. Ex. 46 | 0 | 330 | Syn. Ex. 45 | 0 | 290 | Syn. Ex. 50 |
| Example 52 | Syn. Ex. 1 | 0 | 310 | Syn. Ex. 3 | 0 | 260 | Syn. Ex. 51 |
| Example 53 | Syn. Ex. 4 | 0 | 300 | Syn. Ex. 2 | 0 | 300 | Syn. Ex. 51 |
| Example 54 | Syn. Ex. 11 | 0 | 320 | Syn. Ex. 5 | 0 | 270 | Syn. Ex. 51 |
| Example 55 | Syn. Ex. 43 | 0 | 340 | Syn. Ex. 6 | 0 | 270 | Syn. Ex. 51 |
| Example 56 | Syn. Ex. 8 | 0 | 310 | Syn. Ex. 7 | 0 | 270 | Syn. Ex. 51 |

TABLE 4-continued

| | Adhesive layer A1 | | | Adhesive layer A2 | | | Substrate B |
|---|---|---|---|---|---|---|---|
| Adhesive tape | Coating varnish | Filler (wt %) | Adhesion temperature (° C.) | Coating varnish | Filler (wt %) | Adhesive temperature (° C.) | Coating varnish |
| Example 57 | Syn. Ex. 12 | 0 | 320 | Syn. Ex. 9 | 0 | 280 | Syn. Ex. 54 |
| Example 58 | Syn. Ex. 15 | 0 | 290 | Syn. Ex. 10 | 0 | 240 | Syn. Ex. 54 |
| Example 59 | Syn. Ex. 16 | 0 | 350 | Syn. Ex. 13 | 0 | 250 | Syn. Ex. 54 |
| Example 60 | Syn. Ex. 32 | 0 | 290 | Syn. Ex. 17 | 0 | 270 | Syn. Ex. 54 |
| Example 61 | Syn. Ex. 34 | 0 | 320 | Syn. Ex. 18 | 0 | 260 | Syn. Ex. 55 |
| Example 62 | Syn. Ex. 35 | 0 | 320 | Syn. Ex. 19 | 0 | 220 | Syn. Ex. 50 |
| Example 63 | Syn. Ex. 36 | 0 | 330 | Syn. Ex. 20 | 0 | 260 | Syn. Ex. 54 |
| Example 64 | Syn. Ex. 39 | 0 | 300 | Syn. Ex. 21 | 0 | 230 | Syn. Ex. 55 |
| Example 65 | Syn. Ex. 40 | 0 | 310 | Syn. Ex. 22 | 0 | 240 | Syn. Ex. 50 |
| Example 66 | Syn. Ex. 44 | 0 | 310 | Syn. Ex. 23 | 0 | 230 | Syn. Ex. 54 |
| Example 67 | Syn. Ex. 46 | 0 | 330 | Syn. Ex. 24 | 0 | 270 | Syn. Ex. 55 |
| Example 68 | Syn. Ex. 47 | 0 | 320 | Syn. Ex. 25 | 0 | 240 | Syn. Ex. 50 |
| Example 69 | Syn. Ex. 48 | 0 | 280 | Syn. Ex. 26 | 0 | 210 | Syn. Ex. 51 |
| Example 70 | Syn. Ex. 35 | 0 | 320 | Syn. Ex. 27 | 0 | 260 | Syn. Ex. 54 |
| Example 71 | Syn. Ex. 35 | 0 | 320 | Syn. Ex. 28 | 0 | 260 | Syn. Ex. 55 |
| Example 72 | Syn. Ex. 35 | 0 | 320 | Syn. Ex. 29 | 0 | 250 | Syn. Ex. 50 |
| Example 73 | Syn. Ex. 35 | 0 | 320 | Syn. Ex. 30 | 0 | 290 | Syn. Ex. 51 |
| Example 74 | Syn. Ex. 46 | 0 | 330 | Syn. Ex. 31 | 0 | 260 | Syn. Ex. 54 |
| Example 75 | Syn. Ex. 46 | 0 | 330 | Syn. Ex. 32 | 0 | 290 | Syn. Ex. 55 |
| Example 76 | Syn. Ex. 46 | 0 | 330 | Syn. Ex. 33 | 0 | 260 | Syn. Ex. 50 |
| Example 77 | Syn. Ex. 46 | 0 | 330 | Syn. Ex. 37 | 0 | 280 | Syn. Ex. 51 |
| Example 78 | Syn. Ex. 46 | 0 | 330 | Syn. Ex. 38 | 0 | 270 | Syn. Ex. 52 |
| Example 79 | Syn. Ex. 46 | 0 | 330 | Syn. Ex. 41 | 0 | 260 | Syn. Ex. 53 |
| Example 80 | Syn. Ex. 35 | 0 0 | 320 | Syn. Ex. 1/ Syn. Ex. 10 (60/40) | 0 | 280 | Syn. Ex. 50 |
| Example 81 | Syn. Ex. 35 | 0 0 | 320 | Syn. Ex. 16/ Syn. Ex. 10 (50/50) | 0 | 280 | Syn. Ex. 51 |
| Example 82 | Syn. Ex. 35 | 0 0 | 320 | Syn. Ex. 33/ Syn. Ex. 36 (50/50) | 0 | 280 | Syn. Ex. 54 |
| Example 83 | Syn. Ex. 35 | 0 0 | 320 | Syn. Ex. 8/ Syn. Ex. 26 (20/80) | 0 | 230 | Syn. Ex. 55 |
| Example 84 | Syn. Ex. 35 | 0 | 320 | Syn. Ex. 10 | Alumina 10 | 270 | Syn. Ex. 54 |
| Example 85 | Syn. Ex. 14 | Alumina 10 | 330 | Syn. Ex. 45 | 0 | 290 | Syn. Ex. 54 |
| Example 86 | Syn. Ex. 35 | 0 | 320 | Syn. Ex. 10 | Silica 10 | 270 | Syn. Ex. 54 |
| Example 87 | Syn. Ex. 14 | Silica 10 | 330 | Syn. Ex. 45 | 0 | 290 | Syn. Ex. 54 |
| Example 88 | Syn. Ex. 46 | Silica 1 | 330 | Syn. Ex. 45 | Silica 1 | 290 | Syn. Ex. 42 |

Note)
Alumina: Alumina filler; produced by Showa Denko K.K. particle size: 0.05 μm
Silica: Silica filler; produced by Arakawa Chemical Industries Co., Ltd; particle size: 0.07 μm Comparative Example 3

Using the coating varnish containing polyimide (Tg: 160° C.) obtained in Synthetic Example 10, an adhesive tape having the total thickness 60 μm in which three layers corresponding to the adhesive layer A1, the adhesive layer A2 and the substrate B were laminated in order was produced by the same manner as in Example 41.

Comparative Example 4

The coating varnish containing polyimide (Tg: 160° C.) obtained in Synthetic Example 10 was applied to a side of a 20 μm thick polyimide film (Upirex S, Ube Industries, Ltd.) by a bar-coater so as to have the dried thickness of 20 μm, dried in a hot air circulating oven at 150° C. for 5 minutes, and then the same coating varnish was applied to the other side of the polyimide film by a bar-coater so as to have the dried thickness of 20 μm, followed by drying in a hot air circulating oven at 150° C. for 10 minutes, whereby a three-layer adhesive tape was obtained.

Comparative Example 5

A 20% by weight solution of polyimide varnish (Lark TPI, produced by MITSUI TOATSU CHEMICALS INC.) in N-methyl-2-pyrrolidone was prepared. This solution was applied to a side of a releasing polyethylene terephthalate by a bar-coater so as to have the dried thickness of 20 μm, followed by drying in a hot air circulating oven at 150° C. for 60 minutes to form a layer corresponding to the adhesive layer A1. The same solution was then applied to the formed adhesive layer and dried in the hot air circulating oven at 150° C. for 60 minutes to form a layer corresponding to the substrate B. Further, the same solution was similarly applied to the formed layer and dried in the hot air circulating oven at 150° C. for 120 minutes to form a layer corresponding to the adhesive layer A2. After the releasing film was peeled off, the resultant laminated resin layers were dried at 250° C. for 60 minutes to produce an adhesive tape having the total thickness of 60 μm.

Comparative Example 6

A 20% by weight solution of polyimide varnish (Lark TPI, produced by MITSUI TOATSU CHEMICALS INC.) in N-methyl-2-pyrrolidone was prepared. This solution was applied to a side of a 20 μm thick polyimide film (Upirex S, Ube Industries, Ltd.) by a bar-coater so as to have the dried thickness of 20 μm, dried in a hot air circulating oven at 150° C. for 60 minutes, and then the same coating varnish was applied to the other side of the polyimide film by a bar-coater so as to have the dried thickness of 20 μm, followed by drying in a hot air circulating oven at 150° C. for 120 minutes and additionally drying at 250° C. for 60 minutes, by which a three-layer adhesive tape was obtained.

Comparative Example 7

A 20% by weight solution of polyimide varnish (Lark TPI, produced by MITSUI TOATSU CHEMICALS INC.) in N-methyl-2-pyrrolidone was prepared. This solution was applied to a releasing polyethylene terephthalate film by a bar-coater so as to have the dried thickness of 20 μm and dried in a hot air circulating oven at 150° C. for 60 minutes. After the releasing film was peeled off, it was dried at 250° C. for 60 minutes to form a layer corresponding to the substrate B. To a side of this substrate, a coating varnish obtained in Comparative Synthetic Example 1 was similarly applied and dried in a hot air circulating oven at 150° C. for 10 minutes to form a layer corresponding to the adhesive layer A1. Thereafter, the same coating varnish was applied to the other side of the substrate and dried in a hot air circulating oven at 150° C. for 20 minutes to form a layer corresponding to the adhesive layer A2, by which an adhesive tape having the total thickness of 60 μm was obtained.

Comparative Example 8

A 20% by weight solution of polyimide varnish (Lark TPI, produced by MITSUI TOATSU CHEMICALS INC.) in N-methyl-2-pyrrolidone was prepared. This solution was applied to a releasing polyethylene terephthalate film by a bar-coater so as to have the dried thickness of 20 μm and dried in a hot air circulating oven at 150° C. for 60 minutes. After the releasing film was peeled off, it was dried at 250° C. for 60 minutes to form a layer corresponding to the substrate B. To a side of this substrate, a coating varnish obtained in Comparative Synthetic Example 3 was similarly applied and dried in a hot air circulating oven at 150° C. for 60 minutes to form a layer corresponding to the adhesive layer A2. Thereafter, the coating varnish obtained in Comparative Synthetic Example 1 was applied to the other side of the substrate and dried in a hot air circulating oven at 150° C. for 20 minutes to form a layer corresponding to the adhesive layer A1, by which an adhesive tape having the total thickness of 60 μm was obtained.

Comparative Example 9

A 20% by weight solution of polyimide varnish (Lark TPI, produced by MITSUI TOATSU CHEMICALS INC.) in N-methyl-2-pyrrolidone was prepared. This solution was applied to a releasing polyethylene terephthalate film by a bar-coater so as to have the dried thickness of 20 μm and dried in a hot air circulating oven at 150° C. for 60 minutes. After the releasing film was peeled off, it was dried at 250° C. for 60 minutes to form a layer corresponding to the substrate B. To a side of this substrate, a coating varnish obtained in Comparative Synthetic Example 4 was similarly applied and dried in a hot air circulating oven at 150° C. for 60 minutes to form a layer corresponding to the adhesive layer A1. Thereafter, the coating varnish obtained in Comparative Synthetic Example 1 was applied to the other side of the substrate and dried in a hot air circulating oven at 150° C. for 20 minutes to form a layer corresponding to the adhesive layer A2, by which an adhesive tape having the total thickness of 60 μm was obtained.

Comparative Example 10

A 20% by weight resin solution in o-dichlorophenol obtained in Comparative Synthetic Example 2 was prepared. This solution was applied to a releasing polyethylene terephthalate film by a bar-coater so as to have the dried thickness of 20 μm and dried in a hot air circulating oven at 150° C. for 60 minutes. After the releasing film was peeled off, it was dried at 150° C. for 60 minutes to form a layer corresponding to the substrate B. To a side of this substrate, a coating varnish obtained in Comparative Synthetic Example 3 was similarly applied and dried in a hot air circulating oven at 150° C. for 60 minutes and additionally at 250° C. for 60 minutes to form a layer corresponding to the adhesive layer A2. Thereafter, the coating varnish obtained in Comparative Synthetic Example 1 was applied to the other side of the substrate and dried in a hot air circulating oven at 150° C. for 20 minutes to form a layer corresponding to the adhesive layer A1, by which an adhesive tape having the total thickness of 60 μm was obtained.

Comparative Example 11

A 20% by weight resin solution in o-dichlorophenol obtained in Comparative Synthetic Example 2 was prepared. This solution was applied to a releasing polyethylene terephthalate film by a bar-coater so as to have the dried thickness of 20 μm and dried in a hot air circulating oven at 150° C. for 60 minutes. After the releasing film was peeled off, it was dried at 150° C. for 60 minutes to form a layer corresponding to the substrate B. To a side of this substrate, a coating varnish obtained in Comparative Synthetic Example 4 was similarly applied and dried in a hot air circulating oven at 150° C. for 60 minutes to form a layer corresponding to the adhesive layer A1. Thereafter, the same coating varnish was applied to the other side of the substrate and dried in a hot air circulating oven at 150° C. for 120 minutes to form a layer corresponding to the adhesive layer A2, by which an adhesive tape having the total thickness of 60 μm was obtained.

Comparative Example 12

A 20% by weight resin solution in o-dichlorophenol obtained in Comparative Synthetic Example 2 was prepared. This solution was applied to a releasing polyethylene terephthalate film by a bar-coater so as to have the dried thickness of 20 μm and dried in a hot air circulating oven at 150° C. for 60 minutes. After the releasing film was peeled off, it was dried at 150° C. for 60 minutes to form a layer corresponding to the substrate B. To a side of this substrate, a coating varnish obtained in Synthetic Example 10 was similarly applied and dried in a hot air circulating oven at 150° C. for 10 minutes to form a layer corresponding to the adhesive layer A1. Thereafter, the same coating varnish was applied to the other side of the substrate and dried in a hot air circulating oven at 150° C. for 20 minutes to form a layer corresponding to the adhesive layer A2, by which an adhesive tape having the total thickness of 60 μm was obtained.

Coating varnishes used for forming each layer, fillers and amounts thereof, and adhesion temperatures of the formed adhesive layers in Comparative Examples 3–12 are shown in Table 5.

TABLE 5

| Adhesive tape | Adhesive layer A1 | | | Adhesive layer A2 | | | Substrate B |
| --- | --- | --- | --- | --- | --- | --- | --- |
| | Coating varnish | Filler (wt %) | Adhesion temperature (° C.) | Coating varnish | Filler (wt %) | Adhesive temperature (° C.) | Coating varnish or Resin |
| Com. Ex. 3 | Syn. Ex. 10 | 0 | 240 | Syn. Ex. 10 | 0 | 240 | Syn. Ex. 10 |
| Com. Ex. 4 | Syn. Ex. 10 | 0 | 240 | Syn. Ex. 10 | 0 | 240 | Polyimide |
| Com. Ex. 5 | Lark TPI | 0 | 380 | LARK TPI | 0 | 380 | LARK TPI |
| Com. Ex. 6 | Lark TPI | 0 | 380 | LARK TPI | 0 | 380 | Polyimide |
| Com. Ex. 7 | Com. Syn. Ex. 1 | 0 | 310 | Com. Syn. Ex. 1 | 0 | 310 | Lark TPI |
| Com. Ex. 8 | Com. Syn. Ex. 1 | 0 | 310 | Com Syn. Ex. 3 | 0 | 300 | Lark TPI |
| Com. Ex. 9 | Com. Syn. Ex. 5 | 0 | 310 | Com. Syn. Ex. 1 | 0 | 310 | Lark TPI |
| Com. Ex. 10 | Com. Syn. Ex. 1 | 0 | 310 | Com. Syn. Ex. 3 | 0 | 300 | Com. Syn. Ex. 2 |
| Com. Ex. 11 | Com. Syn. Ex. 4 | 0 | 310 | Com. Syn. Ex. 4 | 0 | 310 | Com. Syn. Ex. 2 |
| Com. Ex. 12 | Syn. Ex. 10 | 0 | 240 | Syn. Ex. 10 | 0 | 240 | Com. Syn. Ex. 2 |

Note)
Polyimide: Upirex S; Produced by Ube Industries, Ltd., thickness 20 μm

In order to evaluate the adhesive tapes obtained in the Examples and Comparative Examples, the following operations were carried out. The releasing polyethylene terephthalate film was removed just before punching the adhesive tape and then assembling of leadframes was carried out.

Figure 2:
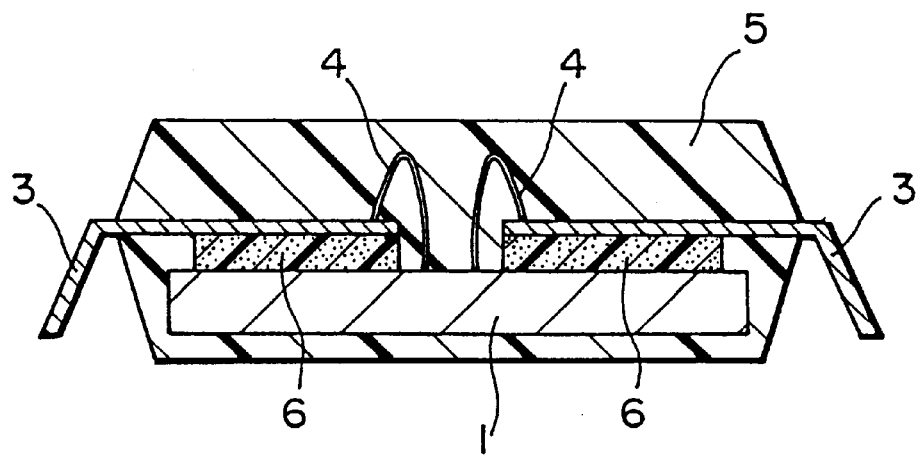
FIG. 2 is a cross-sectional view of another embodiment of a resin-molded type semiconductor device using an adhesive tape of the present invention or a conventional adhesive tape.
Figure 3:
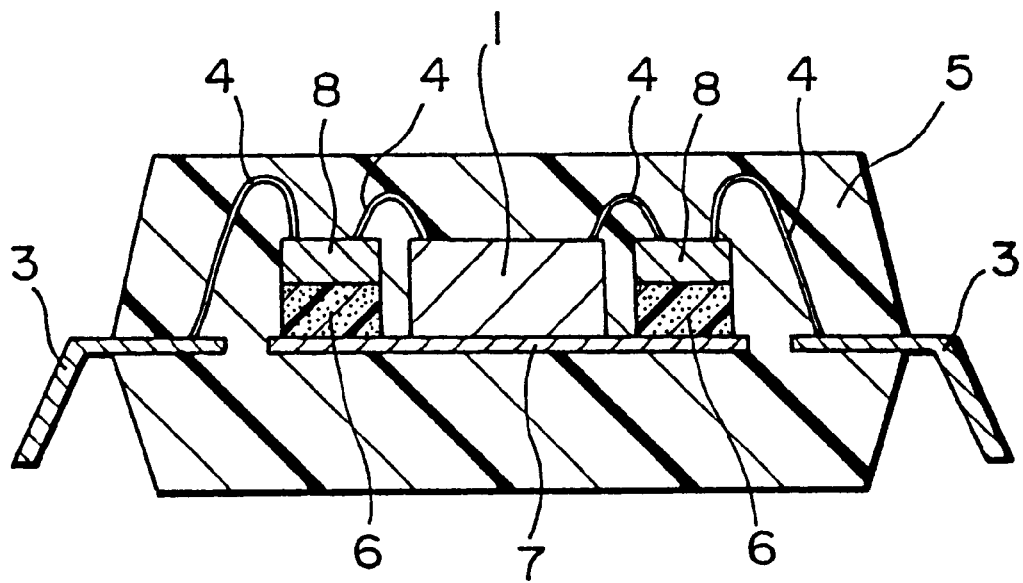
FIG. 3 is a cross-sectional view of still another embodiment of a resin-molded type semiconductor device using an adhesive tape of the present invention or a conventional adhesive tape.

A) Assembling of semiconductor package shown in FIG. 2 (Assembling of Leadframe)

A leadframe used in a semiconductor package as shown in FIG. 2 was assembled using adhesive tapes of Examples 1–40 and Comparative Examples 1 and 2 according to the following procedures.

(a) Punching of Adhesive Tape

The adhesive tape was subjected to punch dying in strip form by a mold.

(b) Assembling of Leadframe

A strip of the punched adhesive tape was positioned on a leadframe and heated under pressure (4 kgf/cm$^2$/1 second) on a hot plate to bond the higher Tg adhesive layer of the adhesive tape to the leadframe, by which assembling of the leadframe was completed. The adhesion temperature in this stage is shown in Tables 2 as adhesion temperature of higher Tg adhesive layer or in Table 3 as adhesion temperature of the first adhesive layer.

Assembling of Semiconductor Package of FIG. 2

Thereafter, the produced leadframe was used to assemble a package according to the following procedures. The reason why the conditions of adhesion and curing were different at the time of assembling the leadframe is that the characteristics of the adhesive tapes are different from one another. Here, optimum conditions for each adhesive tape were selected and the adhesion was carried out based on such conditions.

(a) Die Bonding

A semiconductor chip was adhered to the lower Tg adhesive layer of the adhesive tape which was bonded to the lead frame as described above. The adhesion was carried out on a hot pleat by heating under pressure (4 kgf/cm$^2$/1 second). The adhesion temperature in this stage is shown in Tables 2 as adhesion temperature of lower Tg adhesive layer or in Table 3 as adhesion temperature of the second adhesive layer.

(b) Wire Bonding

Using a wire bonder, a wire pad on the semiconductor chip and a silver plated portion at the end of the inner lead were connected with a gold wire.

(c) Molding

Using an epoxy molding compound, transfer molding was carried out.

(d) Finishing Stage

Via stages of forming, drum cutting, solder plating on the outer leads, etc., the packaging was finished. Evaluations of adhesive tapes and semi-conductor packages(n=10) and results of them (a) Adhesion strength A 90° peel strength of 10 mm wide tape at room temperature was measured after the adhesive tape was adhered (taped) onto a copper plate under the same condition at assembling the leadframe. As the result, the adhesive tapes of Examples 1–40 were found to have a strength ranging from 35–50 g/10 mm, while the adhesive tape of Comparative Example 2 had the strength of 10–40 g/10 mm which meant a large variation. The adhesive tape of Comparative Example 1 had the strength ranging from 35–50 g/10 mm which was allowable.

(b) Embedding of Lead pins

The state of lead pins burying in the adhesive tape was observed when the leadframe had been assembled. In the adhesive tape of Examples 1–40, the lead pins which were embedded in the higher Tg adhesive layer did not cause further embedding, which kept their adhesion state at assembling the lead frame. To the contrary, in Comparative Examples 1 and 2, some of the lead pins warped or moved to damage the flatness when the semiconductor chip was adhered thereto.

(c) Evaluation of Semiconductor packages

The package obtained as described above were tested using the PCT Test (Pressure Cooker Biased Test). This test was carried out at 5 volts of applied voltage at 121° C., at 2 atmospheres and at 100% relative humidity. As the result, the adhesive tapes of Examples 1–40 did not cause shorting even after 1,000 hours. In case of the adhesive tapes of Comparative Examples 1 and 2, some of them caused shorting by touch thereof because the lead pins moved due to softening of the adhesive layer.

B) Assembling of semiconductor package shown in FIG. 1

Assembling of Leadframe

A leadframe used in a semiconductor package as shown in FIG. 1 was assembled using adhesive tapes of Examples 41–88 and Comparative Examples 3–12 according to the following procedures.

(a) Punching of Adhesive Tape

The adhesive tape was subjected to punch dying in ring form by a mold.

(b) Pre-attachment of Adhesive Tape

A metal plane was placed on a hot plate, and the tape punched out in a ring form was pressed onto the plane so as to face the adhesive layer A1 to the plane by means of a metal rod (4 kgf/cm$^2$) to be pre-attached. The adhesion temperature in this stage is shown in Tables 4 and 5 as adhesion temperature of adhesive layer A1.

(c) Assembling of Leadframe

The metal plane to which the adhesive tape had been pre-attached in the above stage and a leadframe were positioned, and heated under pressure (4 kgf/cm$^2$/1 second) on a hot plate heated to adhere the leadframe and the plane via the adhesive tape. The adhesion temperature in this stage is shown in Tables 4 and 5 as adhesion temperature of adhesive layer A2.

Assembling of Semiconductor Package of FIG. 1

Thereafter, the produced leadframe was used to assemble a package according to the following procedures. The reason why the conditions of adhesion and curing were different at the time of assembling the leadframe is that the characteristics of the adhesive tapes are different from each other. Here, optimum conditions for each adhesive tape were selected and the adhesion was carried out based on such conditions.

(a) Die Bonding

A semiconductor chip was adhered to a metal plane portion with a silver paste for die bonding, which was then cured at 150° C. for 2 hours.

(b) Wire Bonding

Using a wire bonder, a wire pad on the semiconductor chip and a silver plated portion at the end of the inner lead were connected with a gold wire.

(c) Molding

Using an epoxy molding compound, transfer molding was carried out.

(d) Finishing Stage

Via stages of forming, dum cutting, solder plating on the outer leads, etc., the packaging was finished.

Evaluations of adhesive tapes and semi-conductor packages and results thereof (a) Adhesion strength A 90° peel strength of 10 mm wide tape at room temperature was measured after the adhesive tape was adhered (taped) onto a copper plate under the same condition at assembling the leadframe. As the result, the adhesive tapes of Examples 41–88 were found to have a strength ranging from 35–50 g/10 mm, while the adhesive tapes of Comparative Examples 4, 6 and 7–12 had the strength of 20–40 g/10 mm which meant a large variation, and caused interfacial separation between the substrate and the adhesive layers. The adhesive tapes of Comparative Examples 3 and 5 had the strength of 35–50 g/10 mm which were allowable.

(b) Embedding of Lead pins

The state of lead pins burying in the adhesive tape was observed when the leadframe had been assembled. In the adhesive tapes of Examples 41–88, embedding of the lead pins embedded in the adhesive layer A2 was prevented by the substrate B and no embedding in the Adhesive layer A1 was observed. In the adhesive tapes of Comparative Examples 3 and 5, the state of embedding changed by each lead pin, some of which contacted with the metal plane. In the adhesive tapes of Comparative Examples 10–12, the state of embedding changed by each lead pin, and some of lead pins dipped into the substrate to damage flatness, though they did not contact with the metal plane. In the adhesive tapes of Comparative Examples 4, 6, 7–9, embedding of the lead pins embedded in the adhesive layer A2 side was prevented by the substrate.

(c) Evaluation of Semiconductor packages

The package obtained as described above were tested using the PCT Test (Pressure Cooker Biased Test). This test was carried out at 5 volts of applied voltage at 121° C., at 2 atmospheres and at 100% relative humidity. As the result, the adhesive tapes of Examples 41–88 did not cause shorting even after 1,000 hours. In case of the adhesive tapes of Comparative Example 4, 6 and 7–12, 8 or more samples of 20 samples caused interfacial separation between the substrate and the adhesive layer, though no shorting took place. The adhesive tapes of Comparative Examples 3 and 5 were allowable.

We claim:

1. In an adhesive tape for electronic parts comprising two adhesive layers provided on both sides of a substrate, the improvement comprising that two adhesive layers are resin layers composed of 100–40% by mol of at least a polyimide comprising at least one of the repeating units represented by the following formulas (1a) and (1b) and 0–60% by mol of at least one of the repeating units represented by the following formulas (2a) and (2b), said two adhesive layers having each a different glass transition temperature:

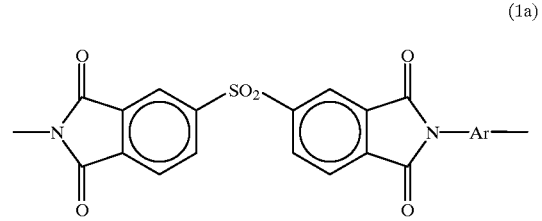

(1a)

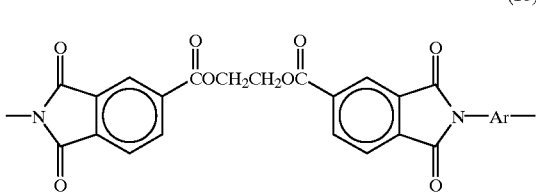

(1b)

wherein Ar represents a divalent group selected from the following formulas containing aromatic rings:

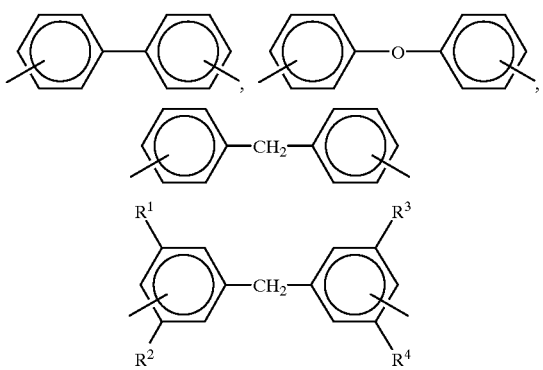

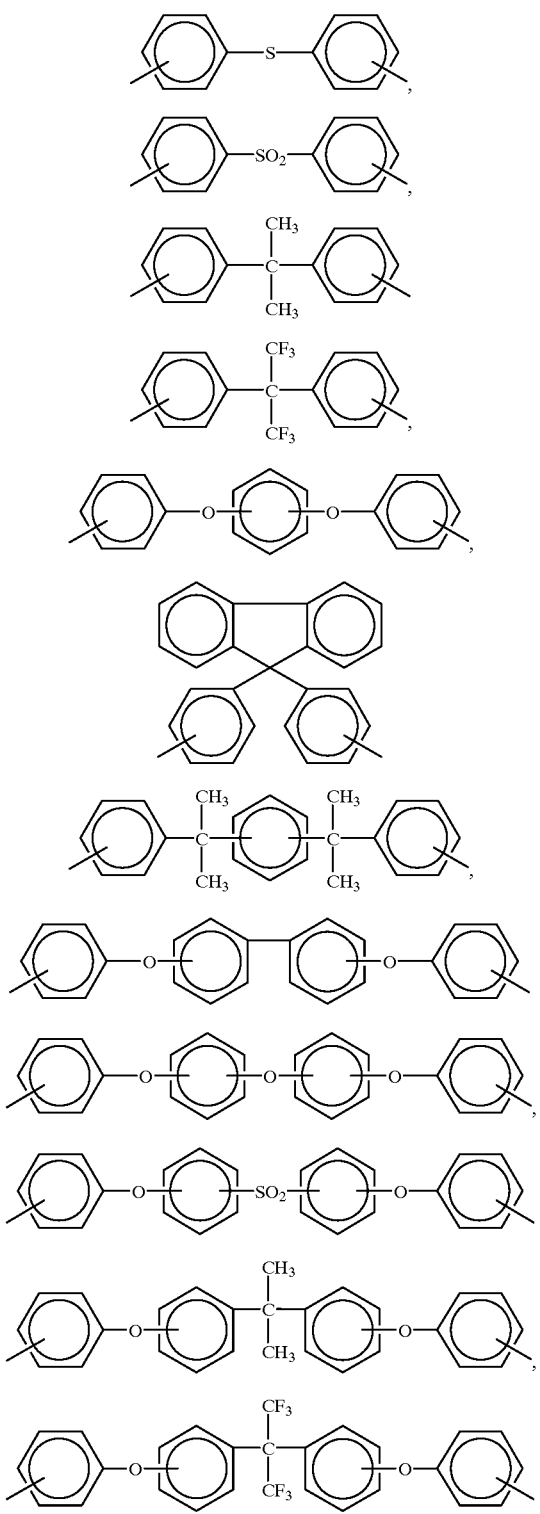

wherein $R_1$, $R_2$, $R_3$ and $R_4$ which may be identical or different represent each a hydrogen atom, an alkyl group having 1–4 carbon atoms or an alkoxy group having 1–4 carbon atoms, provided that $R_1$, $R_2$, $R_3$ and $R_4$ are not hydrogen atoms at the same time,

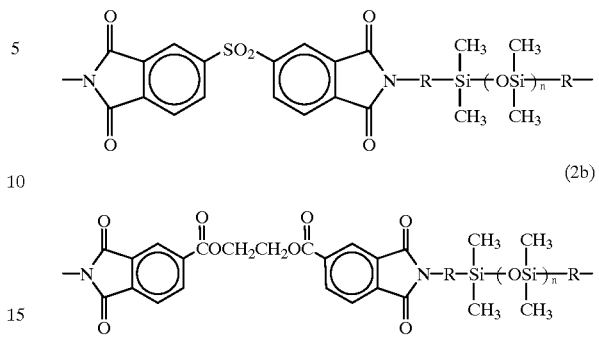

wherein R is an alkylene group having 1 to 10 carbon atoms or —$CH_2OC_6H_4$—, the methylene group of which attaches to Si, and n means an integer of 1 to 20.

2. The adhesive tape for electronic parts as claimed in claim 1, wherein a difference of glass transition temperature between two adhesive layers is at least 30° C.

3. The adhesive tape for electronic parts as claimed in claim 1, wherein at least one of the adhesive layers contains a filler having a particle size of not more than 1 μm in an amount of from 0.1 to 50% by weight.

4. The adhesive tape for electronic parts as claimed in claim 1, wherein a releasing film is provided on a surface of at least one of the adhesive layers.

5. In an adhesive tape for electronic parts comprising two adhesive layers provided on both sides of a substrate, the improvement comprising that the substrate and two adhesive layers are resin layers composed of 100–40% by mol of at least a polyimide comprising at least one of the repeating units represented by the following formulas (1a) and (1b) and 0–60% by mol of at least one of the repeating units represented by the following formulas (2a) and (2b), said substrate being the resin layer having the highest glass transition temperature of all resin layers:

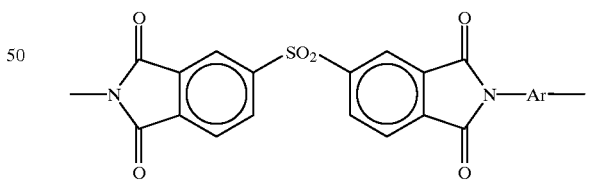

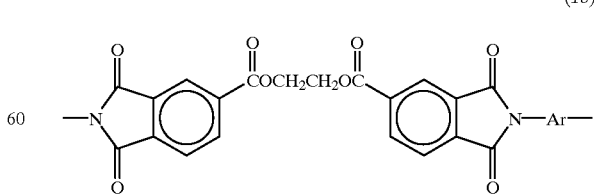

wherein Ar represents a divalent group selected from the following formulas containing aromatic rings:

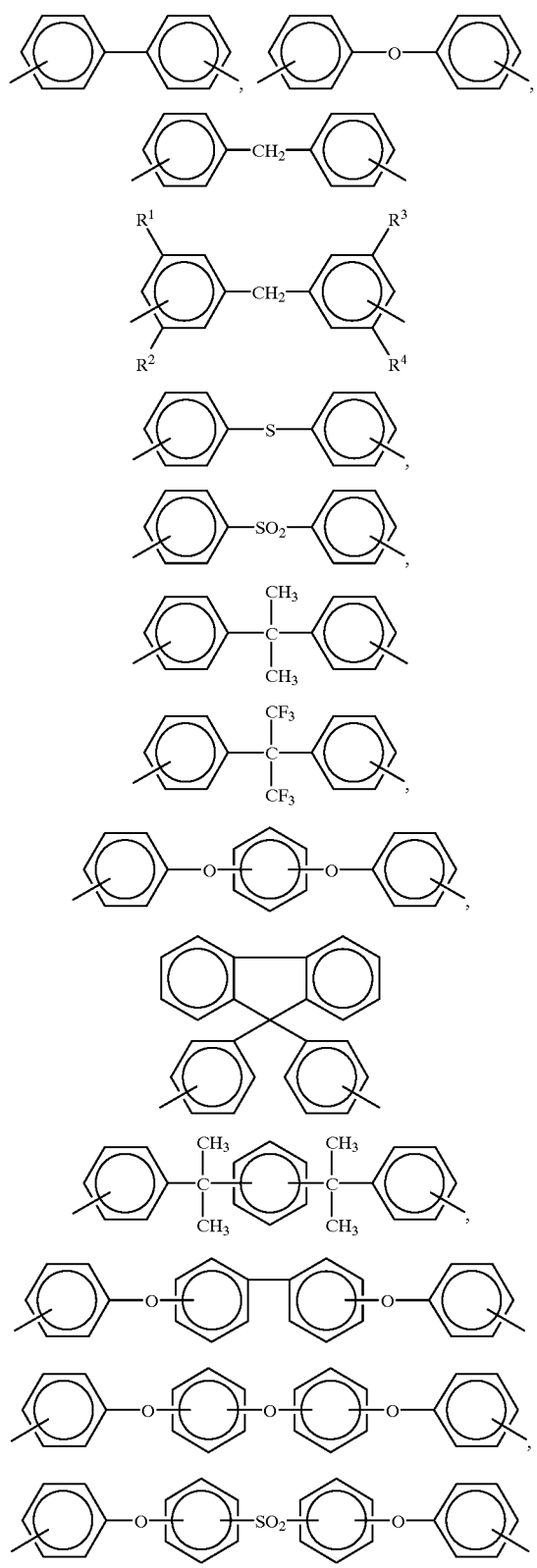

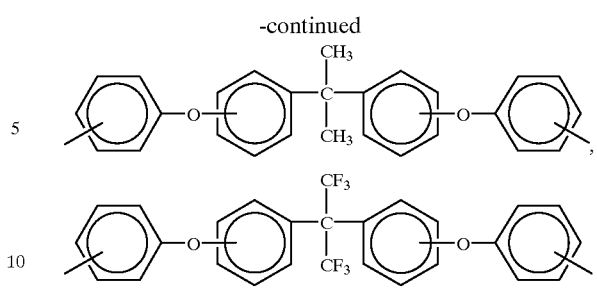

wherein $R_1$, $R_2$, $R_3$ and $R_4$ which may be identical or different represent each a hydrogen atom, an alkyl group having 1–4 carbon atoms or an alkoxy group having 1–4 carbon atoms, provided that $R_1$, $R_2$, $R_3$ and $R_4$ are not hydrogen atoms at the same time, (2a)

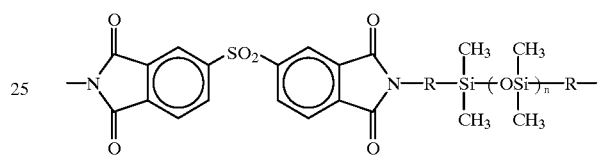

(2b)

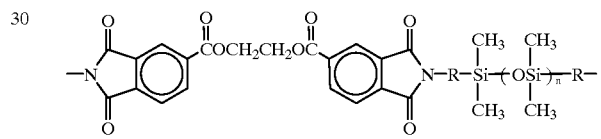

wherein R is an alkylene group having 1 to 10 carbon atoms or —$CH_2OC_6H_4$—, the methylene group of which attaches to Si, and n means an integer of 1 to 20.

6. The adhesive tape for electronic parts as claimed in claim 5, wherein the glass transition temperature of the substrate is at least 40° C. higher than that of both adhesive layers.

7. The adhesive tape for electronic parts as claimed in claim 5, wherein two adhesive layers provided on both sides of the substrate have each a different glass transition temperature.

8. The adhesive tape for electronic parts as claimed in claim 5, wherein at least one of the adhesive layers contains a filler having a particle size of not more than 1 μm in an amount of from 0.1 to 50% by weight.

9. The adhesive tape for electronic parts as claimed in claim 5, wherein a releasing film is provided on a surface of at least one of the adhesive layers.

* * * * *